US006730855B2

United States Patent
Bando

(10) Patent No.: US 6,730,855 B2
(45) Date of Patent: May 4, 2004

(54) ELECTRONIC ELEMENT

(75) Inventor: Koji Bando, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/345,995

(22) Filed: Jan. 17, 2003

(65) Prior Publication Data
US 2004/0047135 A1 Mar. 11, 2004

(30) Foreign Application Priority Data
Sep. 10, 2002 (JP) ........................................ 2002-264030

(51) Int. Cl.[7] ................ H05K 7/06; H01L 23/13; H01L 23/48
(52) U.S. Cl. ............... 174/254; 174/260; 361/749; 257/686; 257/784
(58) Field of Search .................... 257/686, 688, 257/689, 690, 692, 693, 697, 778, 783, 784; 174/254, 260; 361/749–751

(56) References Cited

U.S. PATENT DOCUMENTS

| 5,805,422 A | * | 9/1998 | Otake et al. ................ 361/749 |
| 6,225,688 B1 | * | 5/2001 | Kim et al. ................... 257/686 |
| 6,262,895 B1 | * | 7/2001 | Forthun ....................... 361/749 |

FOREIGN PATENT DOCUMENTS

JP 9-69588 3/1997

* cited by examiner

Primary Examiner—John B. Vigushin
(74) Attorney, Agent, or Firm—McDermott, Will & Emery

(57) ABSTRACT

An wiring board is provided so as to wrap a semiconductor chip, and on the outer surface of wiring board, a plurality of external terminals are provided three-dimensionally, i.e., on the upper, lateral and bottom sides. External terminals are connected to an electrode area of the wiring pattern provided to wiring board for electrically connecting to an external element. According to this configuration, a structure of an electronic element enabling free arrangement of an electronic device addressing various designs of the final products, and an electronic device using the electronic element can be provided.

13 Claims, 23 Drawing Sheets 5, 6: ADHESIVE LAYER 5, 6: ADHESIVE LAYER

ELECTRONIC ELEMENT

BACKGROUND OF THE INVENTION

1. Field of the Invention

The present invention relates to an electronic element, and more specifically, to an electronic element having a structure enabling a three dimensional packaging.

2. Description of the Background Art

As shown in FIG. 45, external terminals 201 of a conventional electronic element (such as a semiconductor element) 200 are often arranged in a line along the sides of electronic element 200 to be suitable for an arrangement on a planer (two-dimensional) substrate such as a print circuit board 210. As a variation of the external terminals, substantially spherical electrodes referred to as bump electrodes may be provided on the same plane facing to the print circuit board of an electronic part.

Additionally, as shown in FIG. 45, in an electronic device (such as a semiconductor device mounted with semiconductor elements compositively) 300, when packaging electronic element 200 to print circuit board 210, electronic element 200 is arranged on a surface of print circuit board 210 two dimensionally, and connected to other electronic device via external connection terminals 220 provided at periphery of print circuit board 210.

As for the electronic device employing the electronic element above, often a plate-like substrate that only utilizes the space two-dimensionally is used, which requires efforts for designing in efficient placement of the plate-like substrate, conforming to various constraints related to the design of final products. Further, in some cases, modification of the design of the final products is required.

SUMMARY OF THE INVENTION

The object of the present invention is to solve the problems above, and to provide the structure of an electronic element enabling free arrangement of an electronic device addressing various designs of the final products, and an electronic device using the electronic element.

An electronic element according to the present invention to solve the problems above includes: an electronic part; a wiring board formed with a flexible material and arranged to surround the electronic part with a prescribed wiring pattern provided to an outer surface thereof for electrically connecting to an electrode area of the electronic part; and a plurality of external terminals arranged to an outer surface of the wiring board three-dimensionally and connected to an electrode area of the wiring pattern for electrically connecting to outside. As the electronic part above, an active element such as a semiconductor chip, and a passive element such as a capacitor and a resistor are included.

According to this configuration, since external terminals are provided to the outer surface of wiring board three-dimensionally, not only conventional two-dimensional arrangement but also three-dimensional arrangement can be implemented in the layout of an electric element. As a result, when designing an electronic device formed with a plurality of electronic elements, the shape of the electronic device may be determined more freely as compared to the conventional shape, and thus freedom in designing the electronic element can largely be improved.

According to an electronic device, the device is configured by connecting respective selected external terminals of the electronic elements above. By employing this configuration, since the electronic elements are arranged three-dimensionally, when designing an electronic device formed with a plurality of electronic elements, the shape of the electronic device may be determined more freely as compared to the conventional shape, and thus freedom in designing the electronic element can largely be improved. Additionally, the number of signals may drastically be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
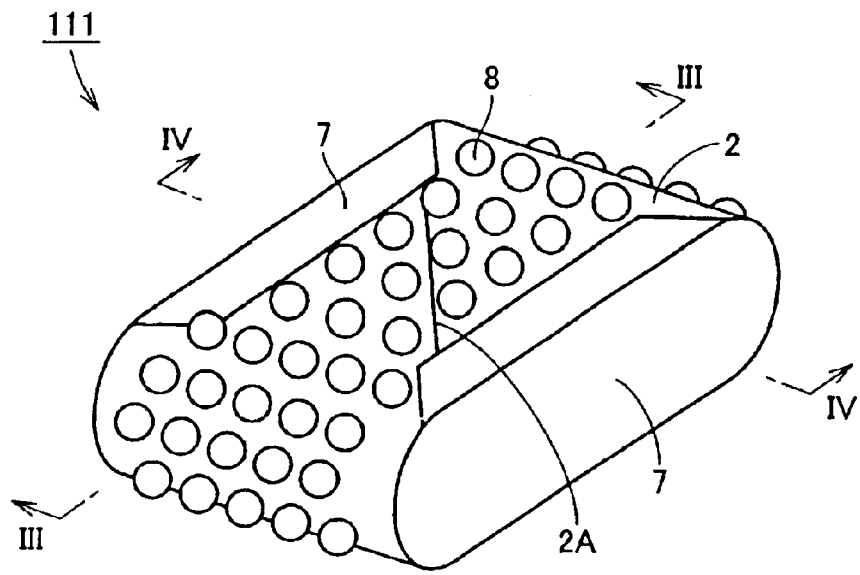
FIG. 1 is an overall perspective view showing the structure of a semiconductor element according to a first embodiment.
Figure 2:
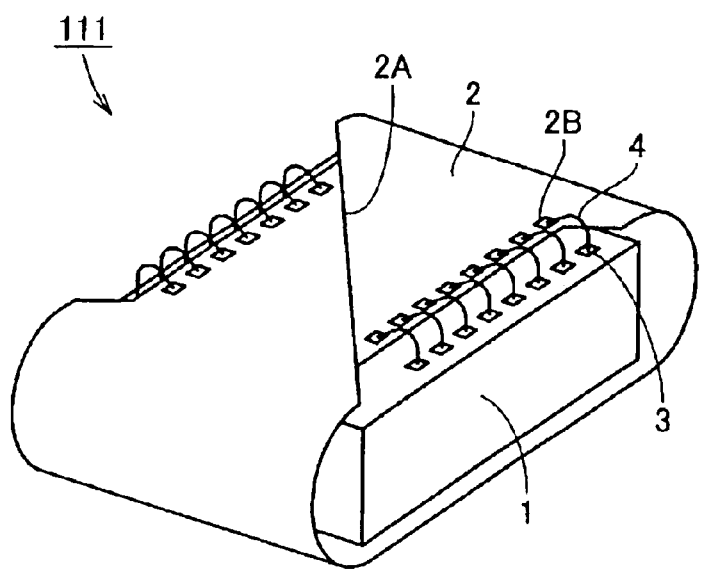
FIG. 2 is a perspective view showing only the internal structure of the semiconductor element according to the first embodiment.
Figure 3:
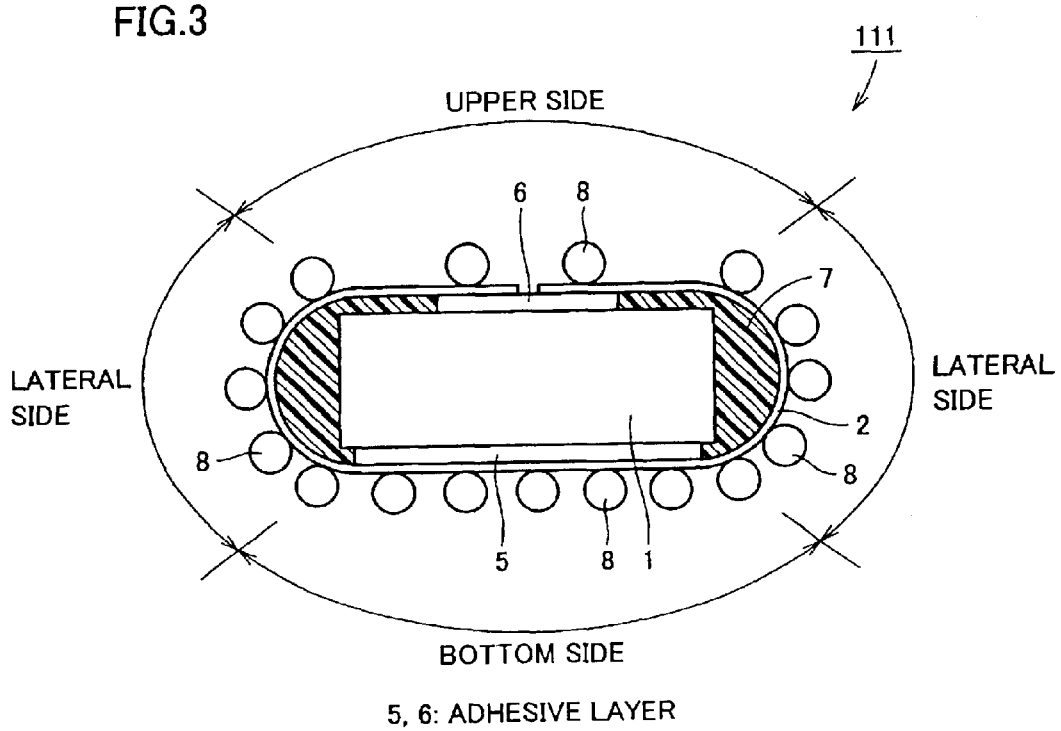
FIG. 3 is a cross sectional view along a line III—III in FIG. 1.
Figure 4:
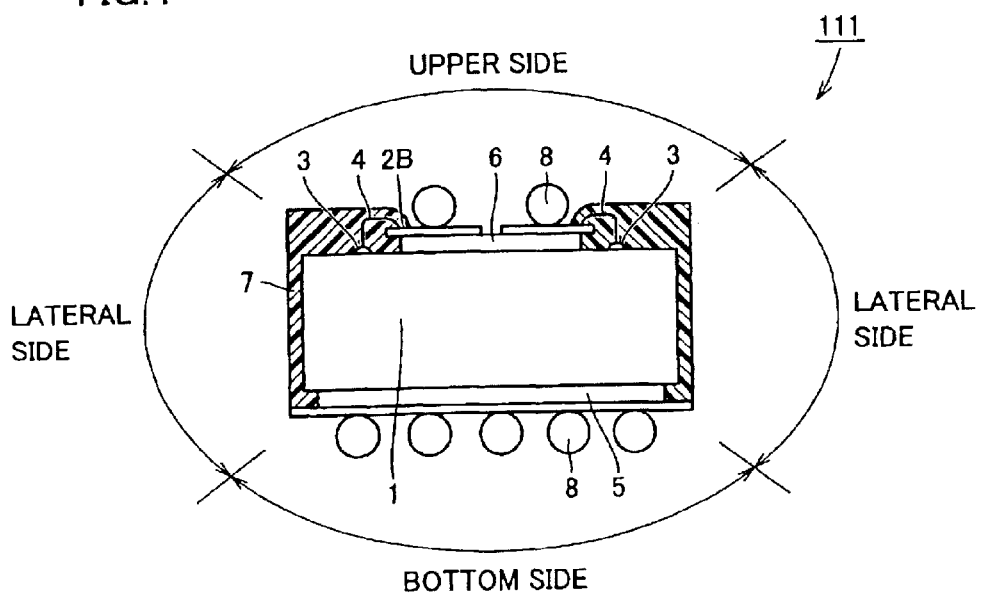
FIG. 4 is a cross sectional view along a line IV—IV in FIG. 1.

In the following, referring to the figures, the structure of an electronic element and an electronic device using the electronic element according to the present invention will be described.

FIRST EMBODIMENT

Referring to FIGS. 1 to 4, the structure of a semiconductor element 111 that is one example of an electronic element according to the present embodiment will be described.

Structure of Semiconductor Element 111

Referring to FIGS. 1 to 4, semiconductor element 111 includes a semiconductor chip 1 as an electronic part therein. On the upper surface of semiconductor chip 1, along opposing sides in the longitudinal direction, a plurality of electrode areas 3 are provided.

A wiring board 2 of a flexible material is provided so as to surround semiconductor chip 1. A possible material for wiring board 2 includes polyimide, glass epoxy and the like.

An abutment portion 2A of opposing ends of wiring board 2 is arranged at the same side where each electrode area 3 of semiconductor chip 1 is provided, so that wiring board 2 wraps semiconductor chip 1.

A predetermined wiring pattern (not shown) is provided on an outer surface of wiring board 2. An electrode area 2B provided on the outer surface of wiring board 2 and electrode area 3 provided on semiconductor chip 1 are electrically connected by wire 4. Wiring board 2 is adhesively fixed to semiconductor chip 1 via adhesive layers 5 and 6.

A sealing resin 7 for sealing is formed so as to cover electrode areas 2B, 3 and wire 4 as well as to fill a space between semiconductor chip 1 and wiring board 2. Sealing resin 7 prevents short circuit between electrode areas 2B, 3 and wire 4, and other external electrical terminal, and further, prevents failure of the connection area between electrode areas 2B, 3 and wire 4. Therefore, reliability of semiconductor element 111 is improved.

On the outer surface of wiring board 2, a plurality of external terminals 8 are provided three-dimensionally, i.e., on the upper, lateral and bottom sides, each of which is to be connected to an electrode area of the wiring pattern for electrically connecting to an external element. External terminals 8 are formed with a metal material or the like, and substantially spherical in shape.

(Variation)

Figure 5:
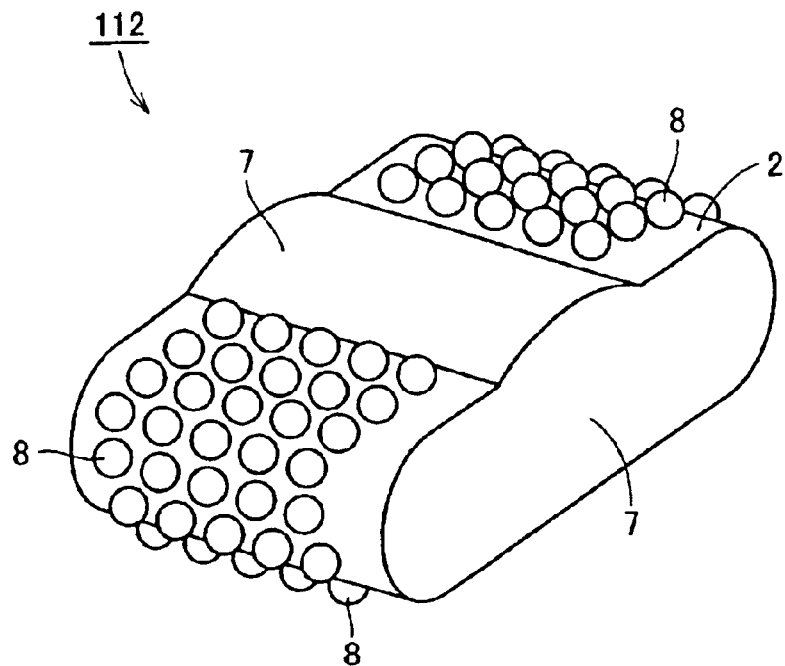
FIG. 5 is an overall perspective view showing the structure of the semiconductor device, in another external shape, according to the first embodiment.
Figure 6:
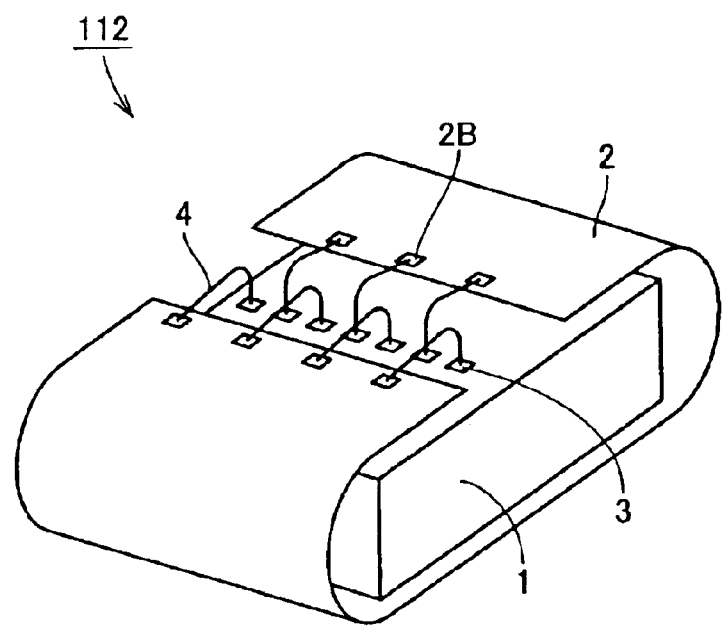
FIG. 6 is a perspective view showing only the internal structure of the semiconductor element shown in FIG. 5.
Figure 7:
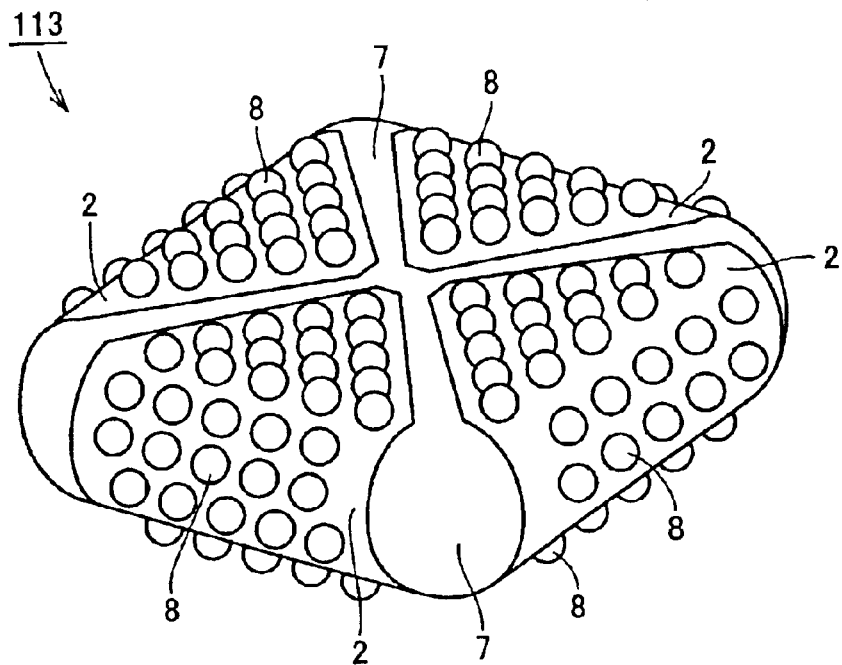
FIG. 7 is an overall perspective view showing the structure of the semiconductor device, in another external shape, according to the first embodiment.
Figure 8:
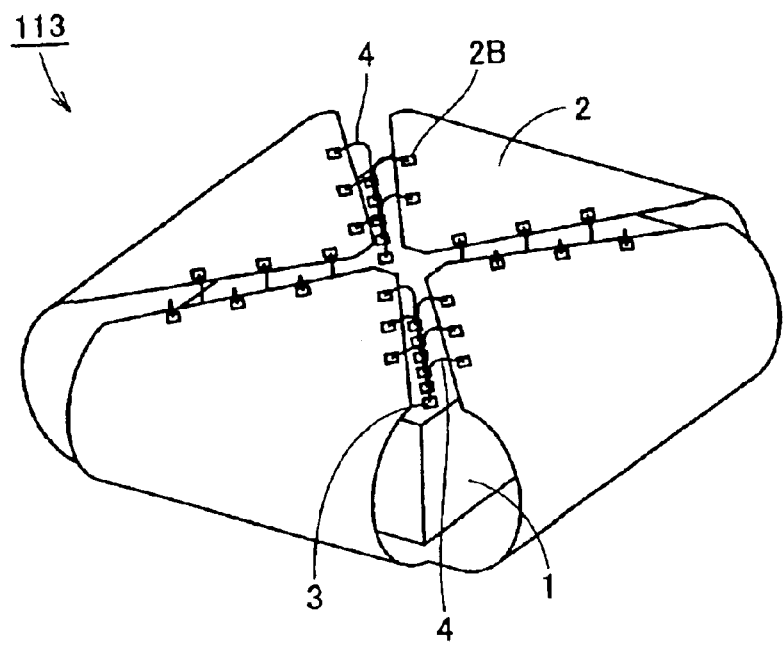
FIG. 8 is a perspective view showing only the internal structure of the semiconductor element shown in FIG. 7.
Figure 9:
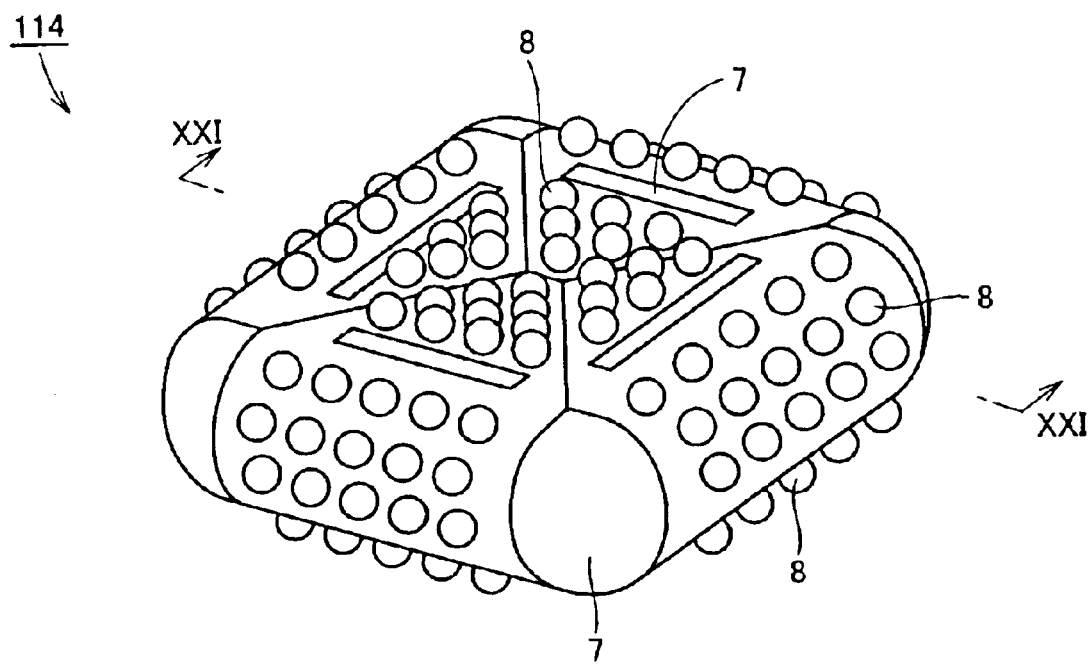
FIG. 9 is an overall perspective view showing the structure of the semiconductor device, in another external shape, according to the first embodiment.
Figure 10:
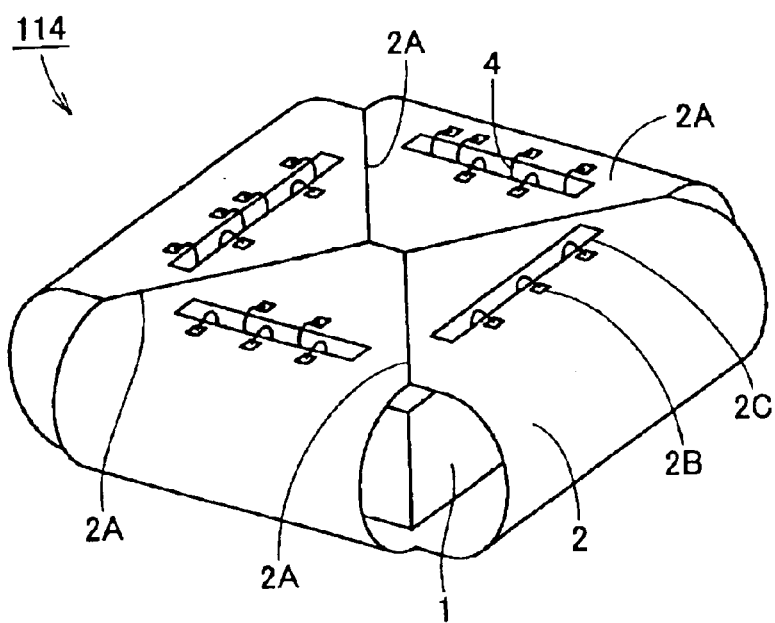
FIG. 10 is a perspective view showing only the internal structure of the semiconductor element shown in FIG. 9.
Figure 11:
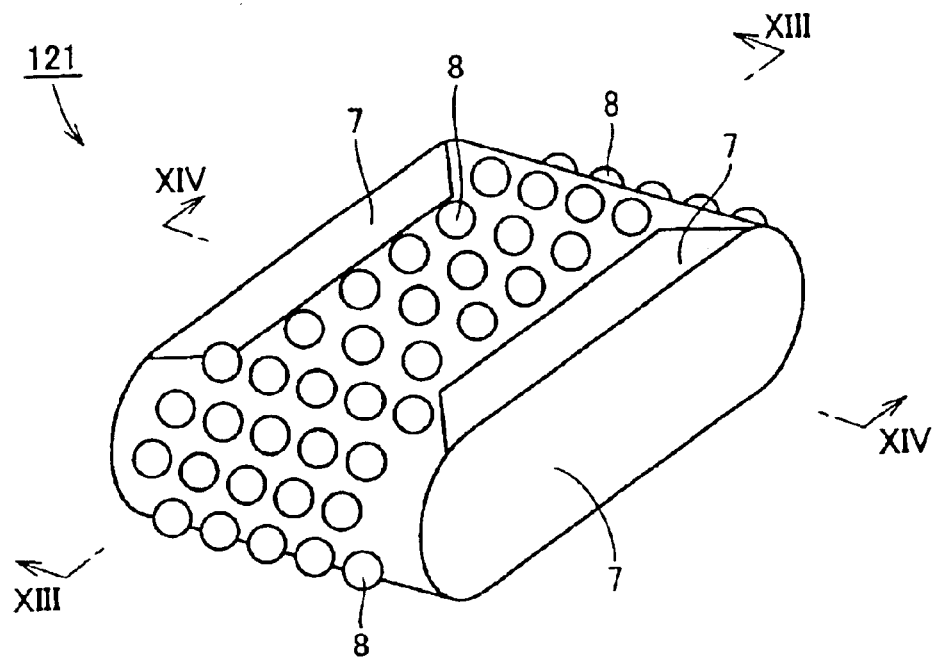
FIG. 11 is an overall perspective view showing the structure of a semiconductor element according to a second embodiment.
Figure 12:
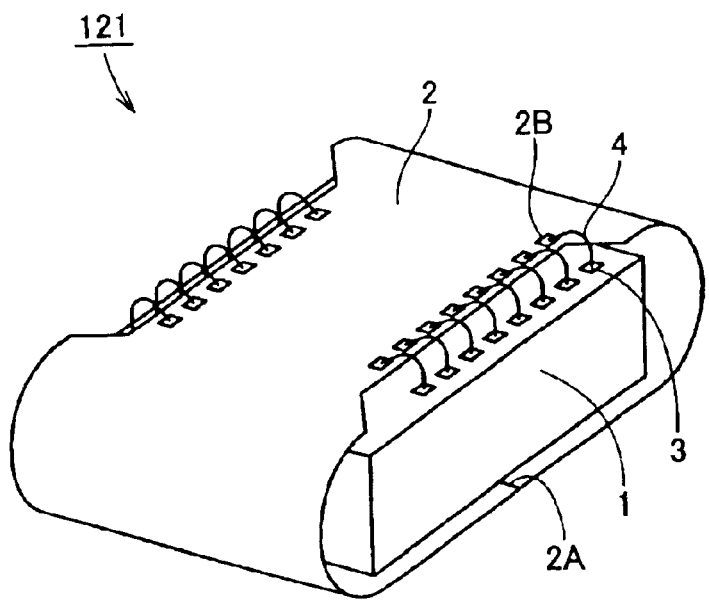
FIG. 12 is a perspective view showing only the internal structure of the semiconductor element according to the second embodiment.
Figure 13:
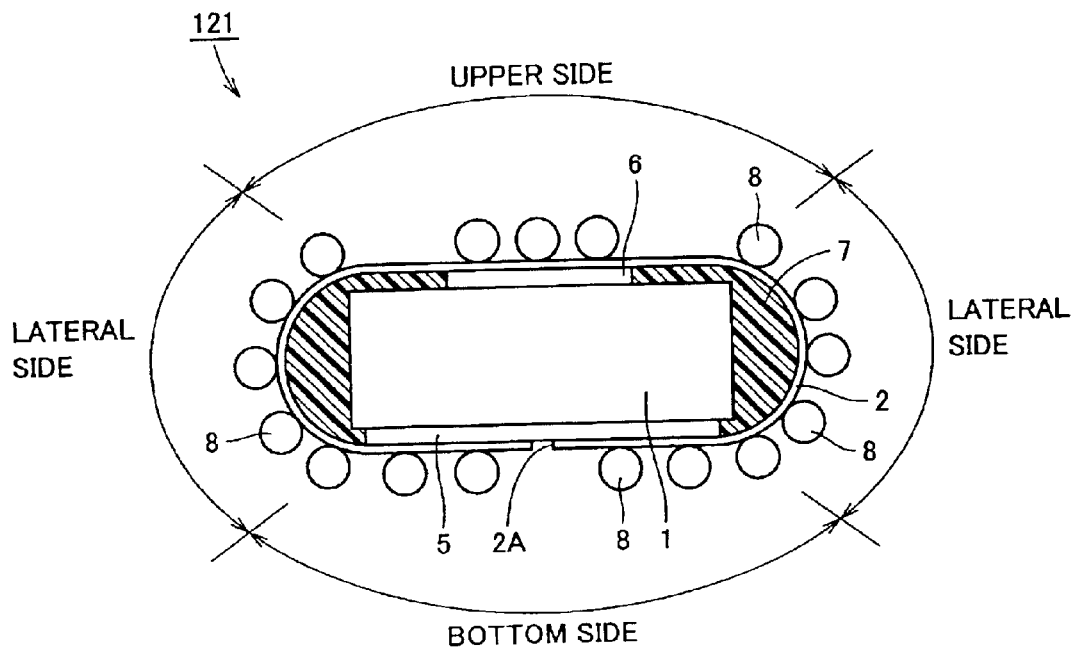
FIG. 13 is a cross sectional view along a line XIII—XIII in FIG. 11.
Figure 14:
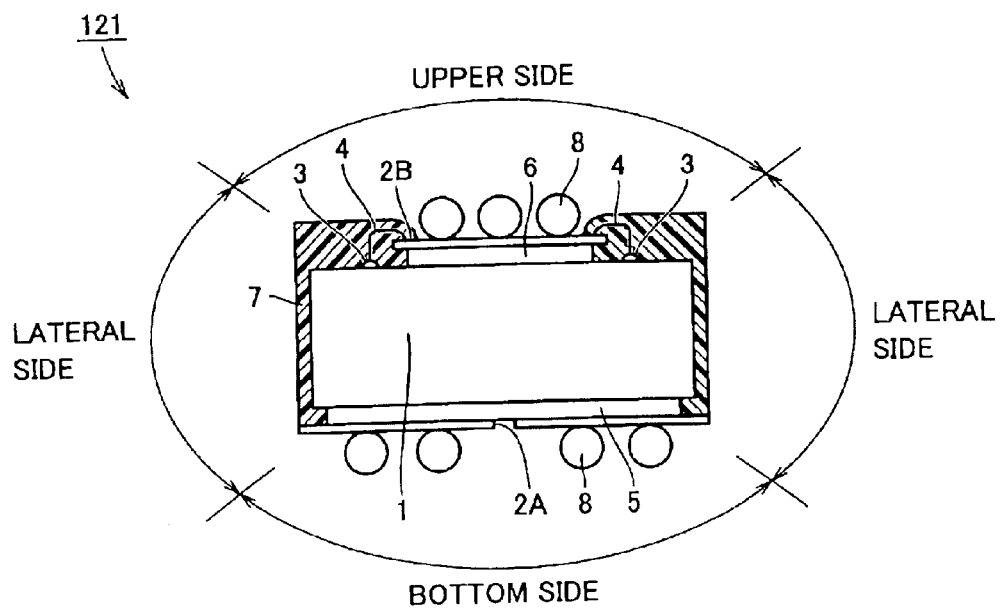
FIG. 14 is a cross sectional view along a line XIV—XIV in FIG. 11.

As semiconductor elements having the structure similar to semiconductor element 111 described above, and having different exterior shape, a semiconductor element 112 shown in FIGS. 5 and 6, a semiconductor element 113 shown in FIGS. 7 and 8, and a semiconductor element 114 shown in FIGS. 9 and 10 can be found.

FIGS. 5, 7 and 9 are overall perspective views showing structures of semiconductor elements 112, 113 and 114, and FIGS. 6, 8 and 10 are perspective views showing only inner structures of semiconductor elements 112, 113 and 114. An identical reference character is given to an identical or similar part to that of semiconductor element 111, and similar description thereof will not be repeated.

Semiconductor element 112 shown in FIGS. 5 and 6 is structured as follows. Electrode areas 3 are provided so as to cross the middle of semiconductor chip 1. External terminals 8 are provided at upper, lateral and bottom sides shown in FIG. 3 (external terminal 8 is not provided to the lateral side shown in FIG. 4).

Semiconductor element 113 shown in FIGS. 7 and 8 is structured as follows. Electrode areas 3 are provided along diagonal line of semiconductor chip 1. Wiring board 2 is folded back conforming to four peripheral sides of semiconductor chip 1. External terminals 8 are provided to all sides of wiring board 2, namely, to upper, lateral and bottom sides.

Semiconductor element 114 shown in FIGS. 9 and 10 is structured as follows. Electrode areas 3 are provided along four peripheral sides of semiconductor chip 1. Openings 2C are provided to wiring board 2 at four portions along four peripheral sides of semiconductor chip 1 for passing wires 4. Wiring board 2 is folded back conforming to four peripheral sides of semiconductor chip 1. External terminals 8 are provided to all sides of wiring board 2, namely, to upper, lateral and bottom sides.

As in the foregoing, according to semiconductor elements 111, 112, 113, and 114 with the structures described above, since external terminals 8 are provided to the outer surface of wiring board 2 three-dimensionally, not only conventional two-dimensional arrangement but also three-dimensional arrangement can be implemented in the layout of an electric element. As a result, when designing an electronic device formed with a plurality of semiconductor elements, the shape of the electronic device may be determined more freely as compared to the conventional shape, and thus freedom in designing electronic element can largely be improved.

As for the positions of external terminals 8, three-dimensional arrangement of external terminals 8 is attained as long as they are provided on three sides including upper, bottom, and any selective lateral sides, and thus the operation and effect above may be attained. Therefore, external terminals 8 are not necessarily be provided to all of the sides. It is also true for the following embodiments.

SECOND EMBODIMENT

Referring to FIGS. 11 to 14, the structure of semiconductor element 121 of one example of an electronic element according to the present embodiment will be described. An identical reference character is given to an identical or similar part to that of semiconductor element 111, and similar description thereof will not be repeated.

Structure of Semiconductor Element 121

Referring to FIGS. 11 to 14, semiconductor element 121 is different from semiconductor element 111 of the first embodiment in that abutment portion 2A of opposing ends of wiring board 2 is provided to the opposite side to the side where electrode areas 3 of semiconductor chip 1 are provided. The rest of the configuration is the same as semiconductor element 111 of the first embodiment.

(Variation)

Figure 15:
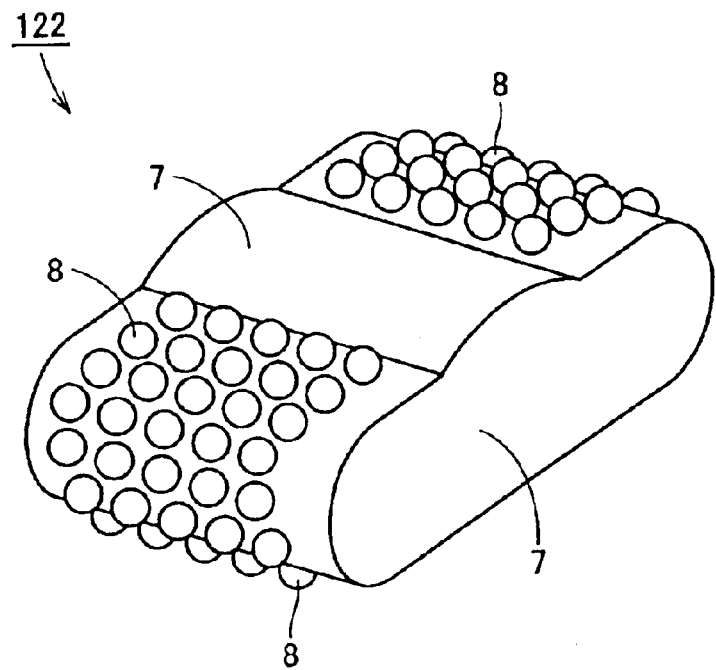
FIG. 15 is an overall perspective view showing the structure of the semiconductor device, in another external shape, according to the second embodiment.
Figure 16:
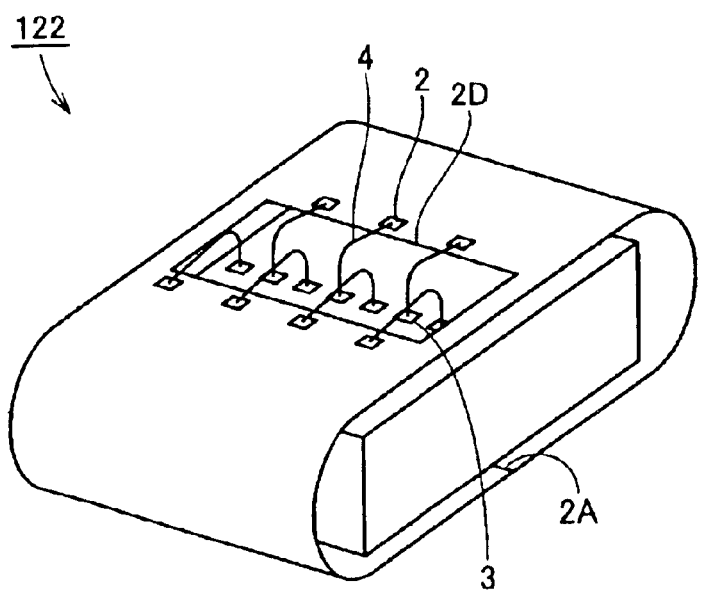
FIG. 16 is a perspective view showing only the internal structure of the semiconductor element shown in FIG. 15.
Figure 17:
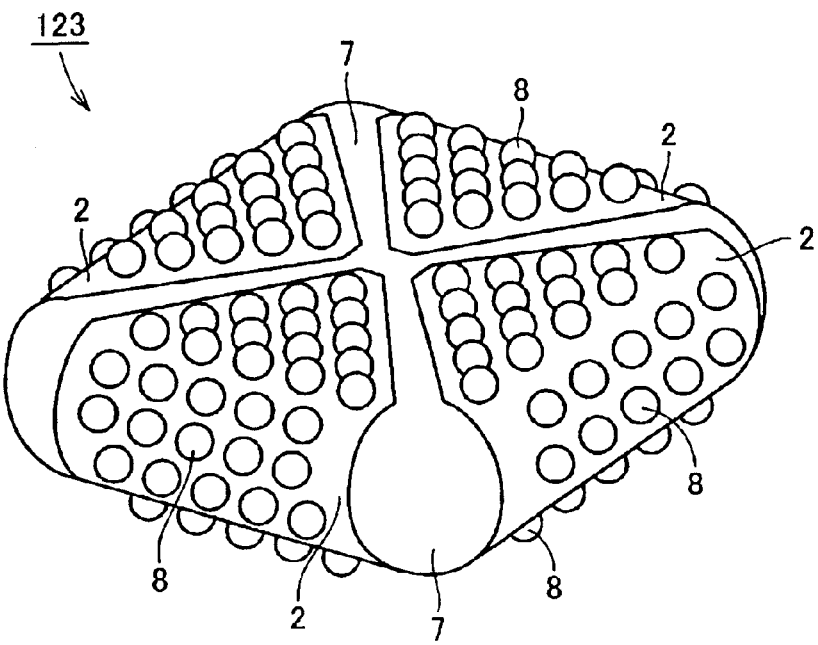
FIG. 17 is an overall perspective view showing the structure of the semiconductor device, in another external shape, according to the second embodiment.
Figure 18:
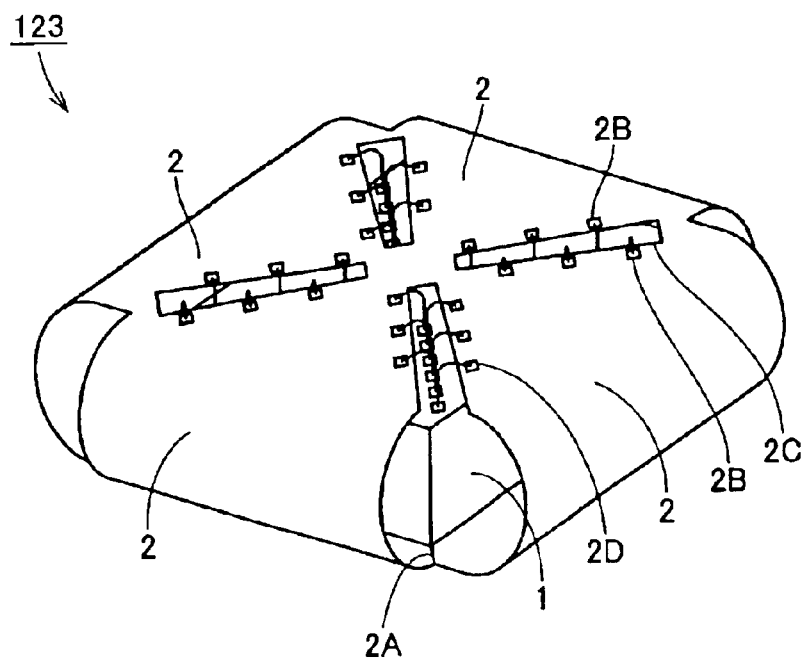
FIG. 18 is a perspective view showing only the internal structure of the semiconductor element shown in FIG. 17.
Figure 19:
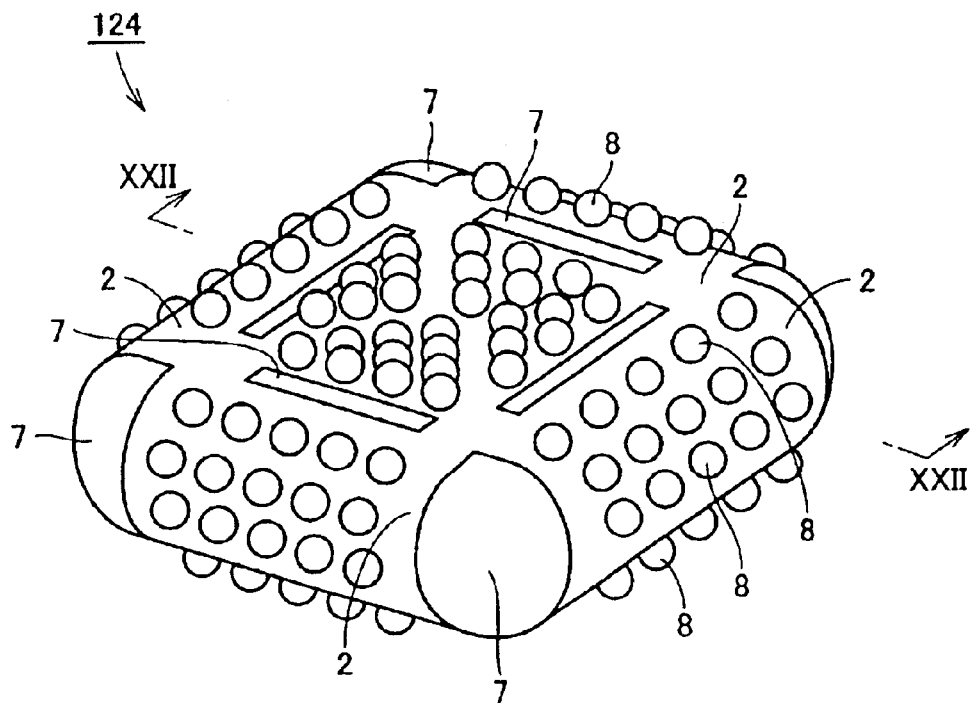
FIG. 19 is an overall perspective view showing the structure of the semiconductor device, in another external shape, according to the second embodiment.
Figure 20:
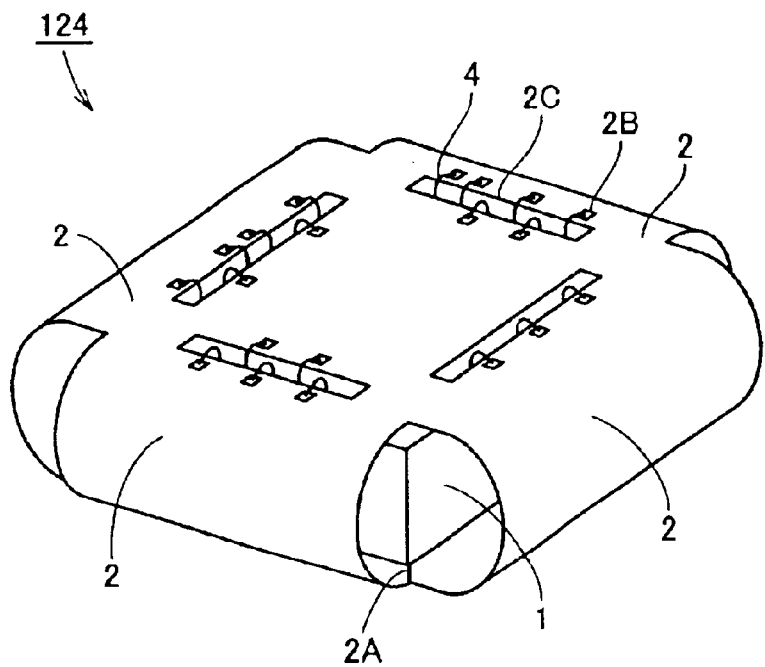
FIG. 20 is a perspective view showing only the internal structure of the semiconductor element shown in FIG. 19.

As semiconductor devices having similar structure to semiconductor element 121 and having different exterior shape, a semiconductor element 122 shown in FIGS. 15 and 16, a semiconductor element 123 shown in FIGS. 17 and 18, a semiconductor element 124 shown in FIGS. 19 and 20 can be found.

FIGS. 15, 17 and 19 are overall perspective views showing structures of semiconductor elements 122, 123 and 124, and FIGS. 16, 18 and 20 are perspective views showing only inner structures of semiconductor elements 122, 123 and 124. An identical reference character is given to an identical or similar part to that of semiconductor element 121, and similar description thereof will not be repeated.

Semiconductor element 122 shown in FIGS. 15 and 16 is structured as follows. Electrode areas 3 are provided so as to cross the middle of semiconductor chip 1. An opening 2D for passing wire 4 is provided to wiring board 2 at the position opposing to the middle portion of semiconductor chip 1. The rest of the configuration is the same with that of semiconductor element 112 shown in FIG. 5, only that abutment portion 2A of opposing ends of wiring board 2 is arranged to the opposite side to the side where electrode areas 3 of semiconductor chip 1 are provided.

Semiconductor element 123 shown in FIGS. 17 and 18 and semiconductor element 124 shown in FIGS. 19 and 20 has the same structure with that of semiconductor element 113 shown in FIG. 7 and semiconductor element 114 shown in FIG. 9, only that abutment portion 2A of opposing ends of wiring board 2 is arranged to the opposite side to the side where electrode areas 3 of semiconductor chip 1 are provided.

As in the foregoing, according to semiconductor elements 121, 122, 123, and 124 with the structure above, since external terminals 8 are provided to the outer surface of wiring board 2 three-dimensionally, not only conventional two-dimensional arrangement but also three-dimensional arrangement can be implemented in the layout of an electric element. As a result, when designing an electronic device formed with a plurality of semiconductor elements, the shape of the electronic device may be determined more freely as compared to the conventional shape, and thus freedom in designing electronic element can largely be improved.

THIRD TO SEVENTH EMBODIMENTS

Referring to FIGS. 21 to 25, other variations of semiconductor element 124 with the structure shown in FIG. 19 of the second embodiment above will be described. Cross sectional structures respectively shown are applicable to the structure shown in FIGS. 9 and 19, as well as to the semiconductor elements 111, 112, 113, and 114 of the first embodiment, and to the semiconductor elements 121, 122, 123, and 124 of the second embodiment.

THIRD EMBODIMENT

Figure 21:
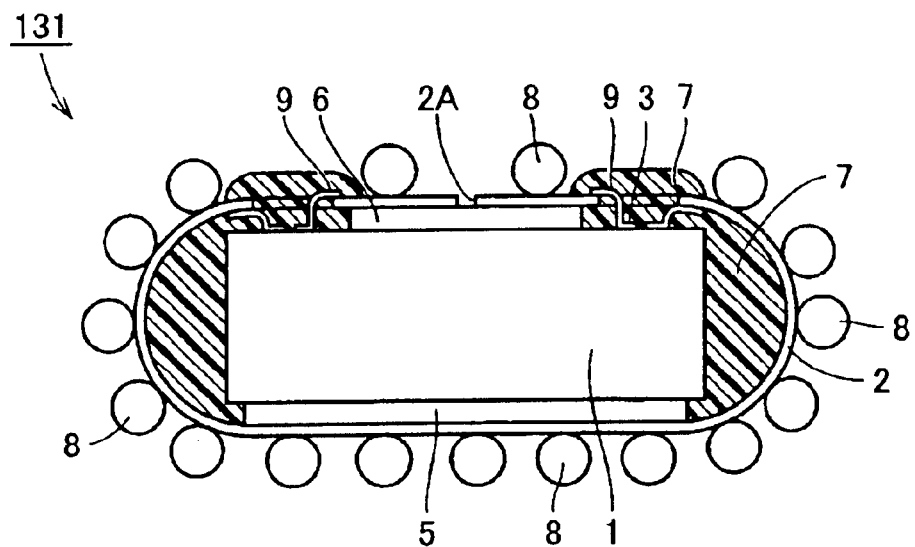
FIGS. 21 to 25 are cross sectional views showing the structure of semiconductor elements according to third to seventh embodiments.

Referring to FIG. 21, the structure of a semiconductor element 131 according to the present embodiment will be described. The structural characteristics of semiconductor element 131 is that it employs an arrangement in which wiring protrusions 9 directly provided on the outer surface of wiring board 2 are used in place of wires 4 used in each embodiment above, to be connected to electrode areas 3 provided on a semiconductor chip 1. According to this configuration, similar operation and effect to the embodiments above can also be attained.

FOURTH EMBODIMENT

Figure 22:
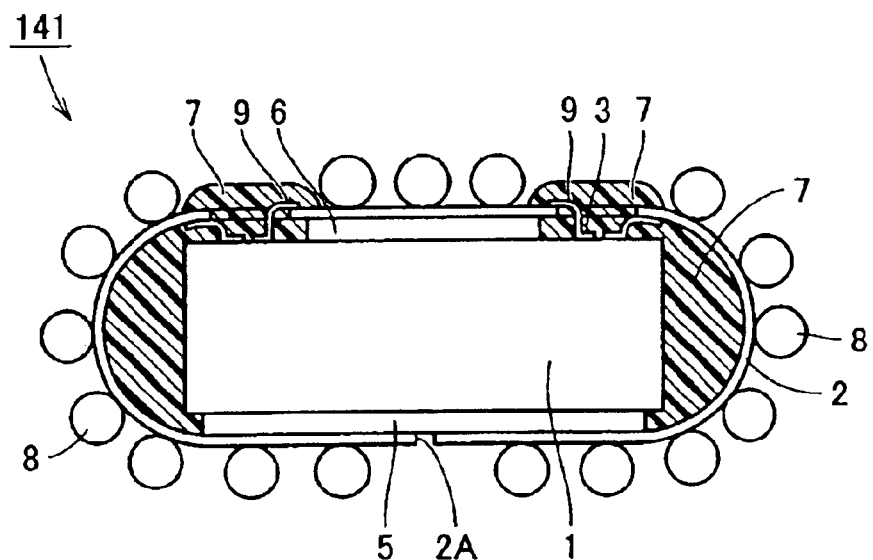

Referring to FIG. 22, the structure of a semiconductor element 141 according to the present embodiment will be described. The structural characteristics of semiconductor element 141 is only different from that of semiconductor element 131 above in that abutment portion 2A of opposing ends of wiring board 2 is arranged to the opposite side to the side where electrode areas 3 of semiconductor chip 1 are provided. The rest of the configuration is the same with that of semiconductor element 131 according to the third embodiment. According to this configuration, similar operation and effect to the embodiments above can also be attained.

FIFTH EMBODIMENT

Figure 23:
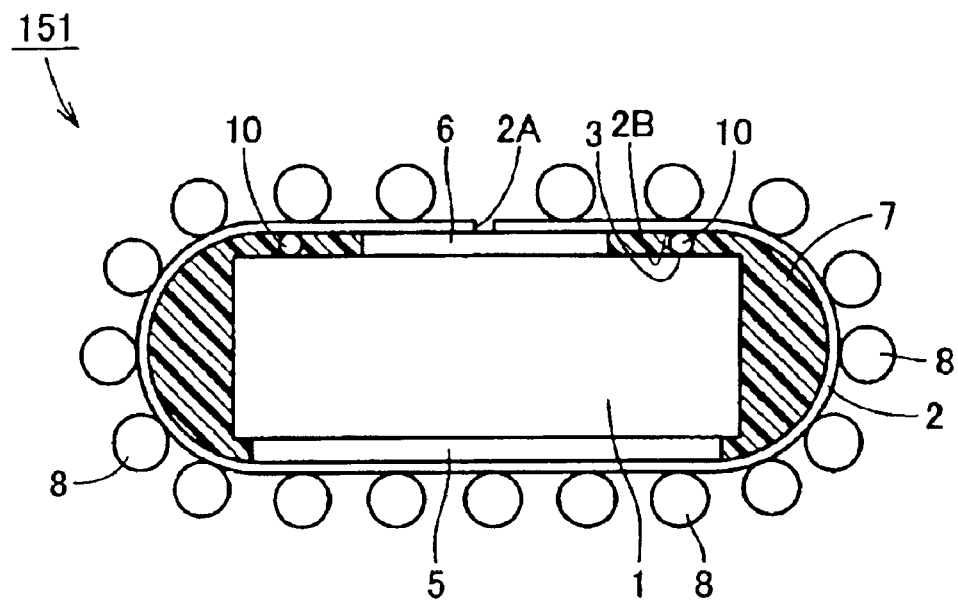

Referring to FIG. 23, the structure of a semiconductor element 151 according to the present embodiment will be described. The structural characteristics of semiconductor element 151 is that, as compared to semiconductor element 131 above, electrode area 2B of wiring board 2 is provided at the inner surface of wiring board 2, and electrode area 2B and electrode area 3 provided on semiconductor chip 1 are connected with conductive bump 10. According to this configuration, similar operation and effect to the embodiments above can also be attained.

SIXTH EMBODIMENT

Figure 24:
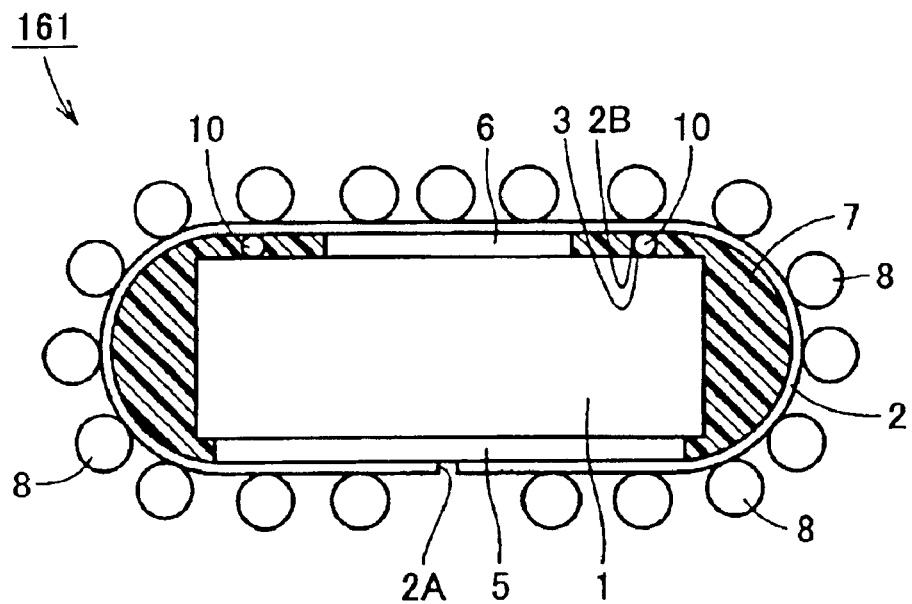

Referring to FIG. 24, the structure of a semiconductor element 161 according to the present embodiment will be described. The structural characteristics of semiconductor element 161 is only different from that of semiconductor element 151 above in that abutment portion 2A of opposing ends of wiring board 2 is arranged to the opposite side to the side where electrode areas 3 of semiconductor chip 1 are provided. The rest of the configuration is the same with that of semiconductor element 151 according to the fifth embodiment. According to this configuration, similar operation and effect to the embodiments above can also be attained.

SEVENTH EMBODIMENT

Figure 25:
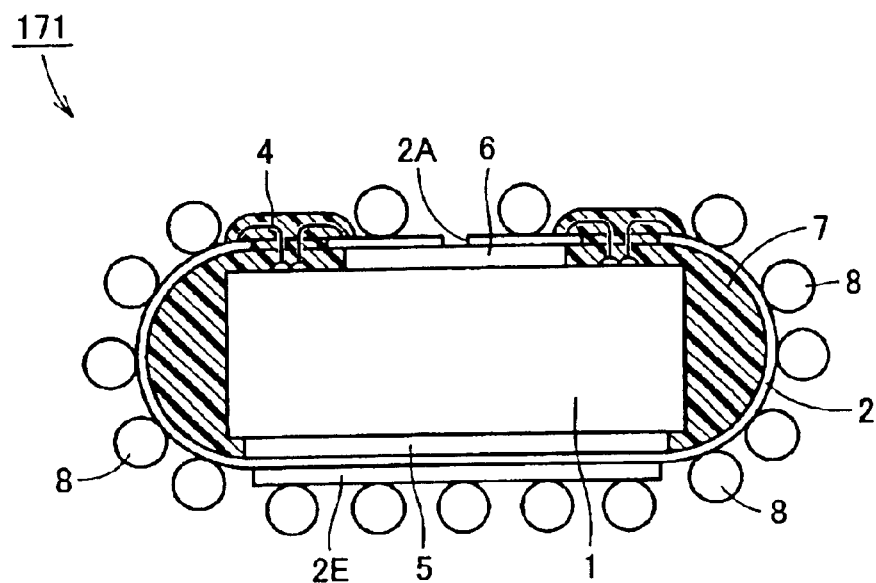

Referring to FIG. 25, the structure of a semiconductor element 171 according to the present embodiment will be described. The structural characteristics of semiconductor element 171 is different from the structures of embodiments described above in that an interconnection layer 2E is further provided to the outer surface of wiring board 2 for increasing the total number of interconnections. According to this configuration, similar operation and effect to the embodiment above can also be attained. It should be noted that the same operation and effect can be attained where abutment portion 2A of opposing ends of wiring board 2 is arranged to the opposite side to the side where electrode areas 3 of semiconductor chip 1 are provided.

EIGHTH EMBODIMENT

Figure 26:
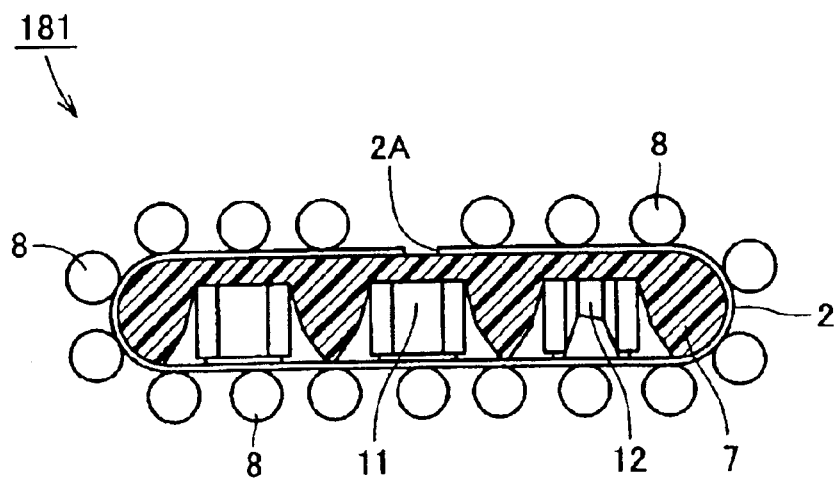
FIG. 26 is a cross sectional view showing the structure of an electronic element according to an eighth embodiment.

The first to seventh embodiments are all related to the semiconductor element using semiconductor chip 1 as an active element, while the present embodiment is related to an electronic element 181 in which, as shown in a cross sectional view of FIG. 26, a passive element 11, 12 such as illustrated condenser, resistor or the like is covered with wiring board 2. The rest of the configuration is the same with the first to seventh embodiments, only that each semiconductor chip 1 thereof is replaced by passive element 11, 12.

According to this configuration also, since external terminals 8 are provided to the outer surface of wiring board 2 three-dimensionally, not only conventional two-dimensional arrangement but also three-dimensional arrangement can be implemented in the layout of a passive element. As a result, when designing an electronic device formed with a plurality of passive elements, the shape of the electronic device may be determined more freely as compared to the conventional shape, and thus freedom in designing electronic element can largely be improved.

NINTH TO ELEVENTH EMBODIMENTS

The first to eighth embodiments are all related to the structure of the electronic elements, while the present ninth to tenth embodiments are related to the structure of a device using the electronic elements described in the first to eighth embodiments. In the following, though a case in which semiconductor element 171 of the seventh embodiment is used will be described, it is not limited to semiconductor element 171, and semiconductor elements 111, 112, 113, 114, 121, 122, 123, 124, 131, 141, 151, and 161, and electronic element 181 can also be employed.

NINTH EMBODIMENT

Figure 27:
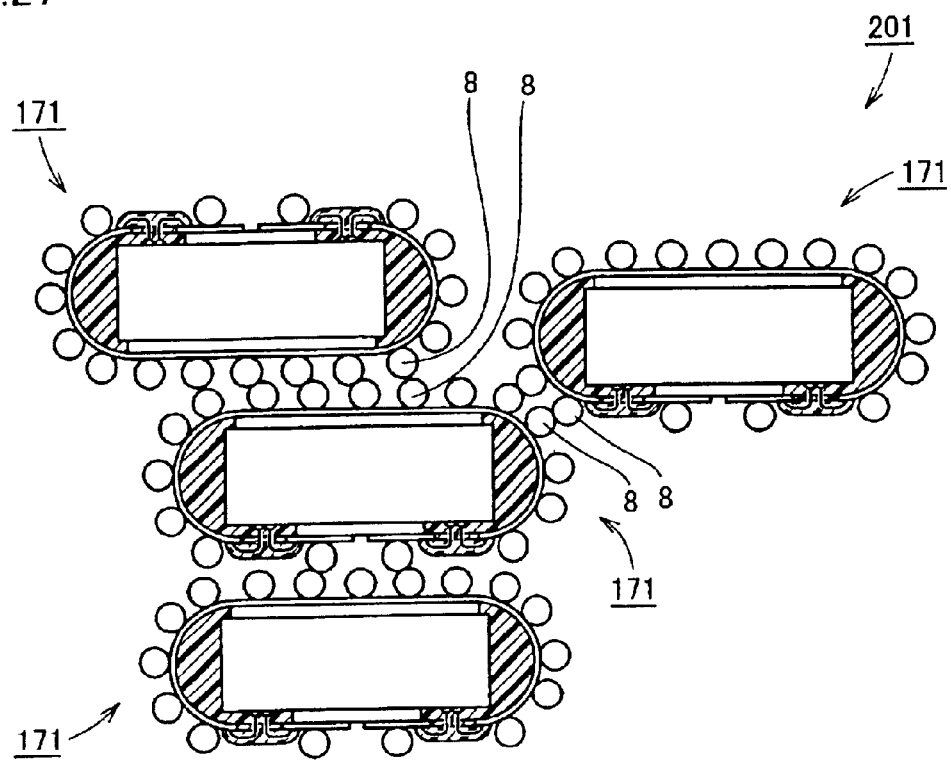
FIG. 27 is a cross sectional view showing the overall structure of a semiconductor element according to a ninth embodiment.

Referring to FIG. 27, the structure of electronic device 201 in the present embodiment will be described. Electronic device 201 is structured three-dimensionally, by directly connecting external terminals 8 to each other, which are selected from external terminals 8 provided on semiconductor element 171.

According to this configuration, since semiconductor elements 171 are arranged three-dimensionally, when designing electronic device 201 formed with a plurality of semiconductor elements 171, the shape of electronic device 201 may be determined more freely as compared to the conventional shape, and thus freedom in designing electronic device 201 can largely be improved. Additionally, the number of signals may drastically be increased.

TENTH EMBODIMENT

Figure 28:
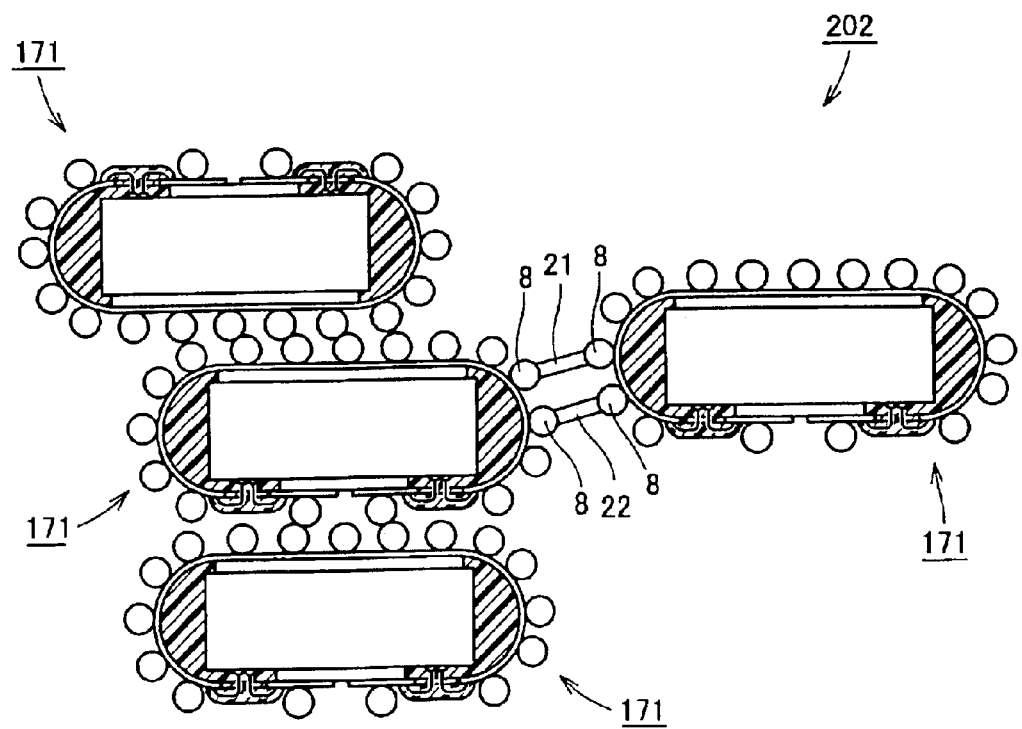
FIG. 28 is a cross sectional view showing the overall structure of a semiconductor element according to a tenth embodiment.

Referring to FIG. 28, the structure of electronic device 202 in the present embodiment will be described. Semiconductor device 202 is characterized in that, as compared to the structure of electronic device 201, it has a conductive member intervened between external terminals 8 connected to each other. As the conductive member, a conductive part 21, a passive element 22 or the like can be used. Thus, according to the present configuration also, the same operation and effect similar to the ninth embodiment can be attained.

ELEVENTH EMBODIMENT

Figure 29:
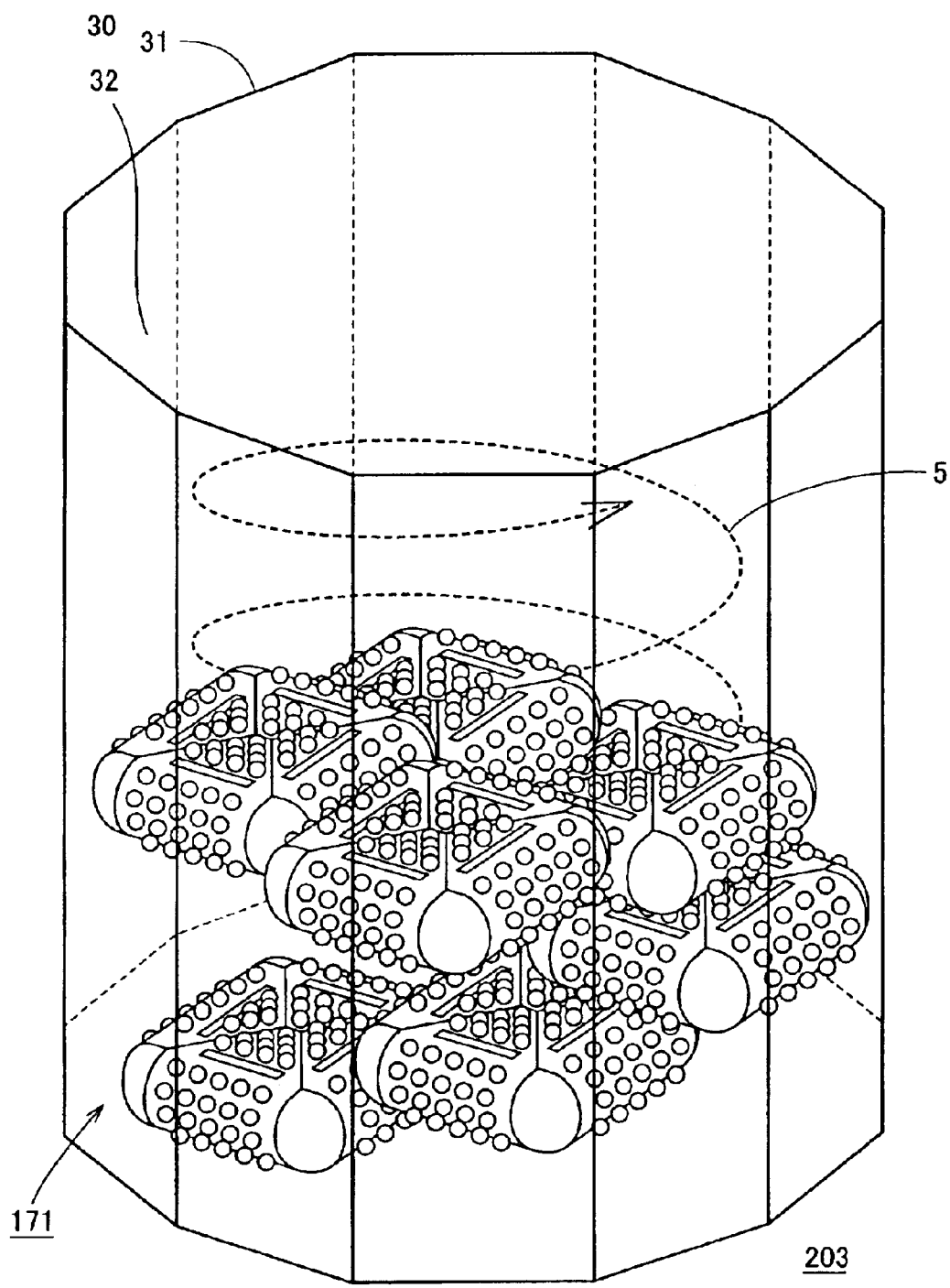
FIG. 29 is a cross sectional view showing the overall structure of a semiconductor element according to an eleventh embodiment.
Figure 30:
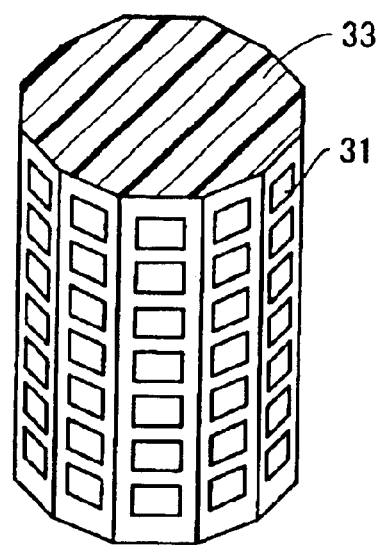
FIG. 30 is a perspective view showing the overall structure of a semiconductor element according to the eleventh embodiment.

Referring to FIGS. 29 and 30, the structure of electronic apparatus 203 in the present embodiment will be described. An electronic apparatus 203 is configured as follows: a plurality of semiconductor elements 171 are provided in a cylindrical substrate 30 having a plurality of external electrodes 31 and a plurality of internal electrodes 32 at prescribed positions, and selectively connecting external terminals 8 on semiconductor elements 171 to each other. Though in the present embodiment semiconductor elements 171 are arranged in helical fashion, it is not limited to the helical fashion and any three-dimensional structure of arbitrary layered structure may be employed. As shown in FIG. 30, cylindrical substrate 30 is filled inside with resin 33 in order to attain resin sealing. According to the present configuration also, the same operation and effect similar to the ninth embodiment can be attained.

TWELFTH EMBODIMENT

Figure 31:
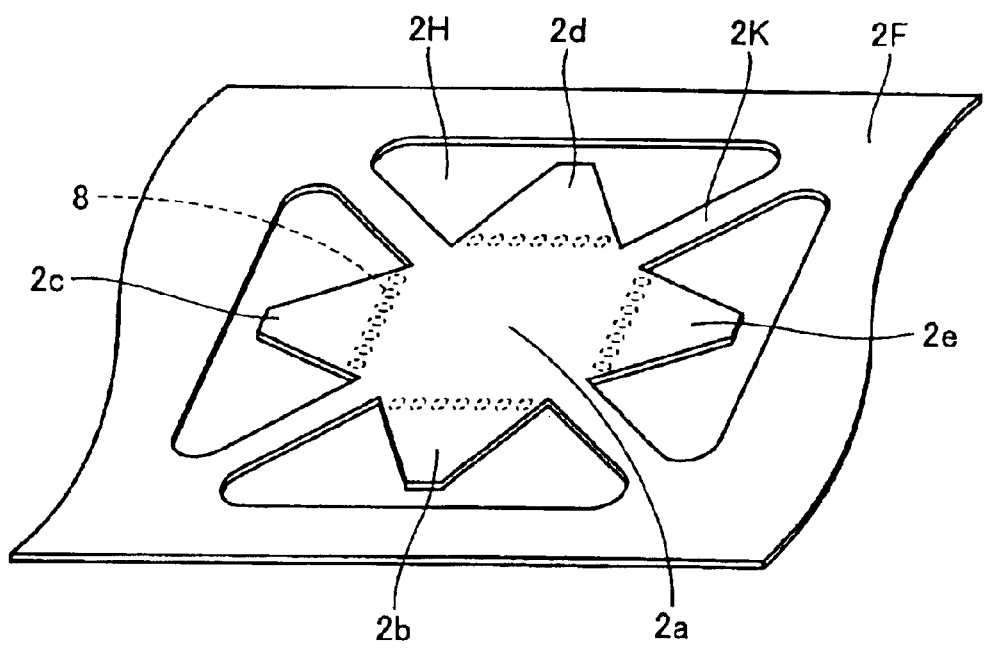
FIGS. 31 to 37 are illustrations related to first to seventh steps showing a manufacturing method of a semiconductor element according to a twelfth embodiment.

Next, referring to FIGS. 31 to 37, a method for manufacturing the semiconductor element above will be described, using semiconductor element 113 according to the first embodiment shown in FIG. 7 as an example. First, as shown in FIG. 31, a band-like wiring board 2F is prepared, and prescribed shape of openings 2H are punched at four position, to form folding areas 2b, 2c, 2d, and 2e in substantially triangle shape, extending radially from four peripheral sides of bottom area 2a in substantially quadrangle shape. In order to improve working efficiency, bottom area 2a is connected to band-like wiring board 2F by frames 2K. Then, to the prescribed positions on the outer surface of connection portion between bottom area 2a and folding areas 2b, 2c, 2d, and 2e, external terminals 8 are attached in advance.

Figure 32:
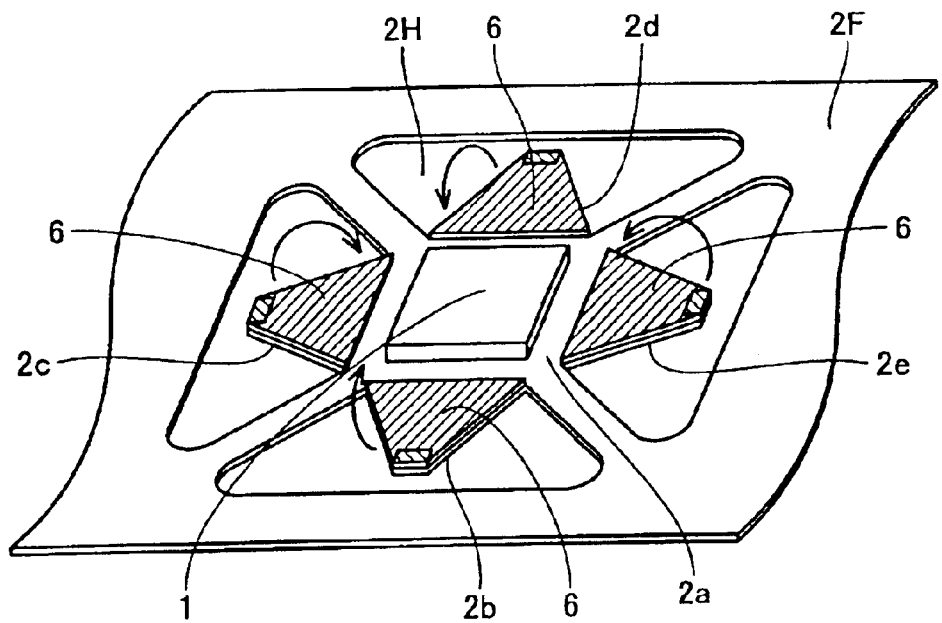
Figure 33:
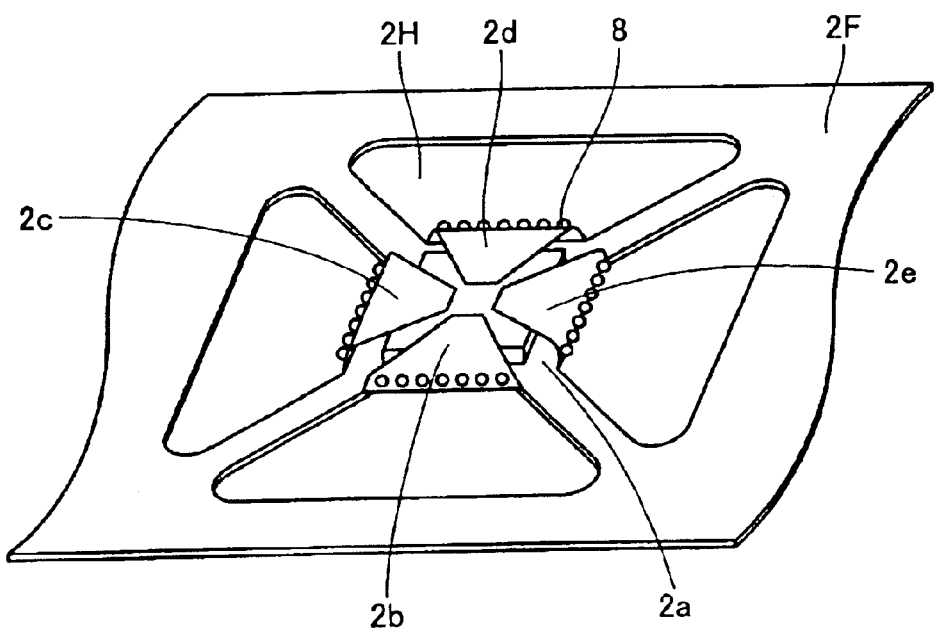

Next, referring to FIG. 32, semiconductor chip 1 is fixed to bottom area 2a by an adhesive tape (adhesive layer) 5. To each of folding areas 2b, 2c, 2d, and 2e also, an adhesive tape (adhesive layer) 6 is applied in advance. Thereafter, referring to FIG. 33, folding areas 2b, 2c, 2d, and 2e are folded so as to wrap semiconductor chip 1, and fixed to front side of semiconductor chip 1.

Figure 34:
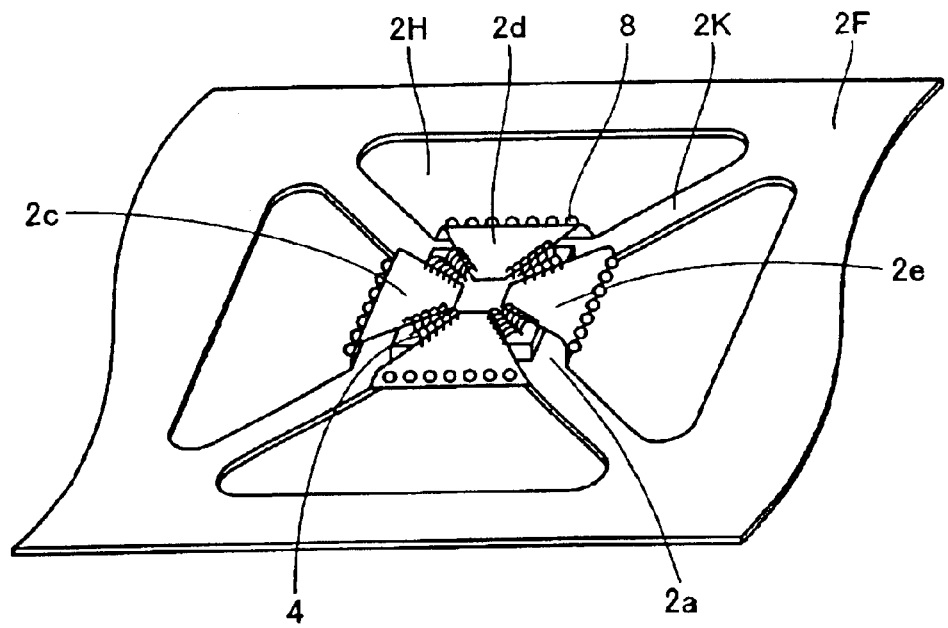
Figure 35:
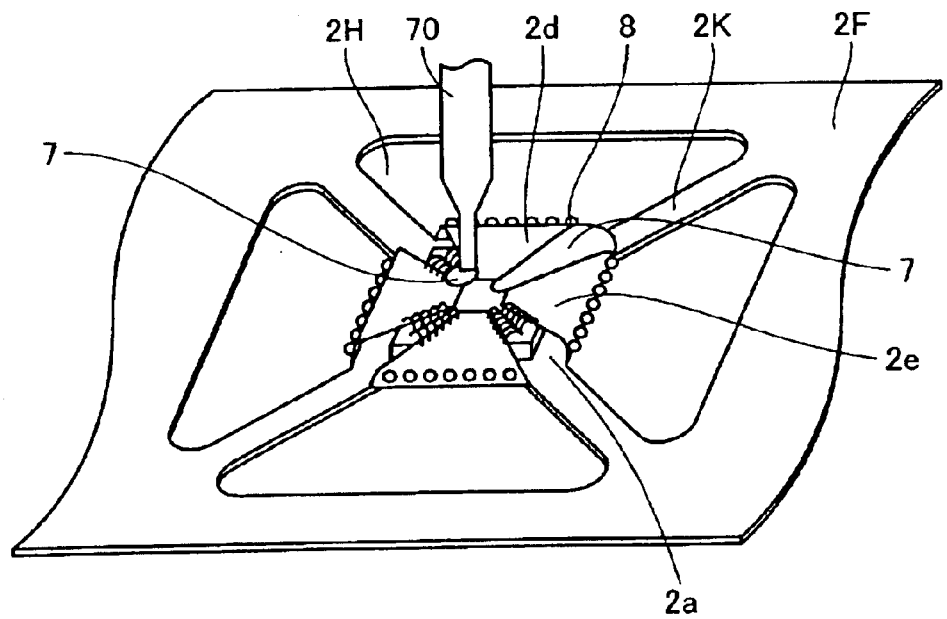
Figure 36:
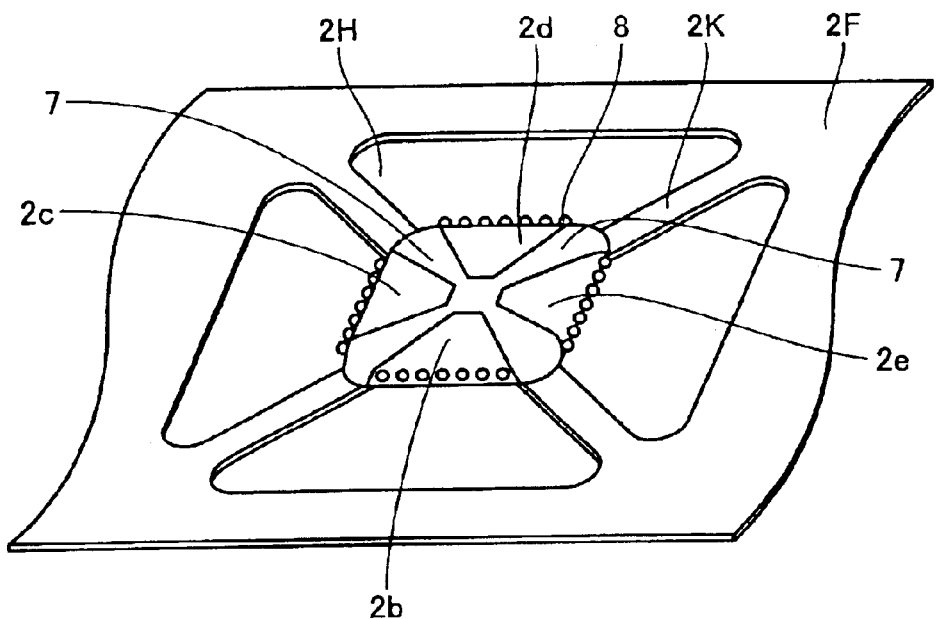

Next, referring to FIG. 34, electrode area 2B provided on the outer surface of wiring board 2 and electrode area 3 provided on semiconductor chip 1 is connected by wire 4 (wire bonding). Thereafter, referring to FIGS. 35 and 36, resin 7 is injected by a resin injecting device 70 so as to cover the connection area of wire 4 between electrode areas 2B and 3 as well as to bury the space between semiconductor chip 1 and wiring board 2 (resin sealing).

Figure 37:
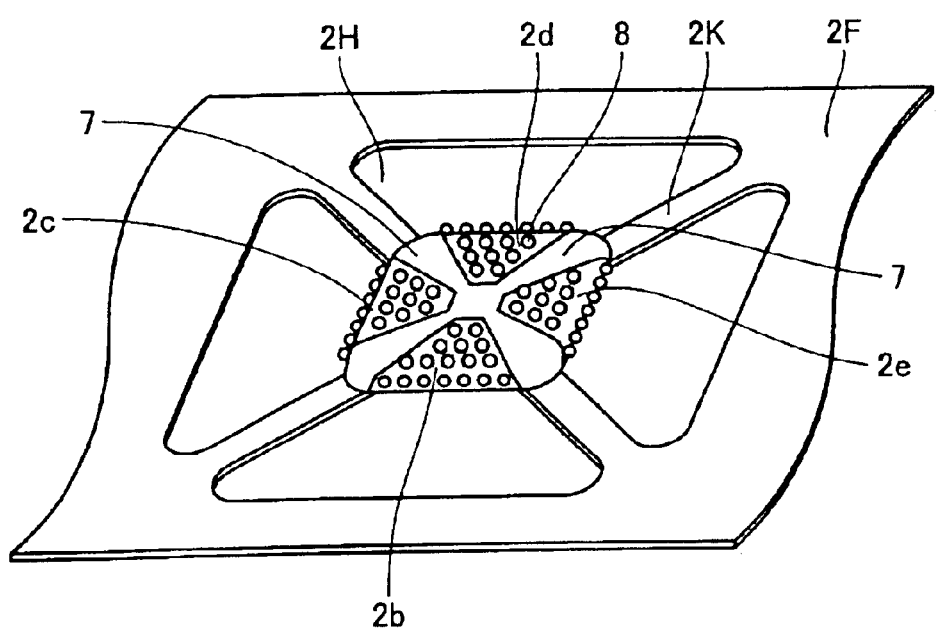

Next, referring to FIG. 37, a plurality of external terminals 8 are attached to prescribed positions at the outer surface of bottom area 2a and folding areas 2b, 2c, 2d, and 2e. Thereafter, by cutting frames 2K of band-like wiring board 2F, semiconductor element 113 is completed.

As described above, by forming semiconductor element 113 utilizing band-like wiring board 2F, wiring board 2 can be arranged to surround semiconductor chip 1 and external terminals 8 can be attached to the outer surface of wiring board 2. Additionally, since it is applicable to a mass production line, productivity can also be improved.

THIRTEENTH EMBODIMENT

Next, referring to FIGS. 38 to 44, a method for manufacturing the semiconductor element above will be described, using semiconductor element 114 shown in FIG.

Figure 38:
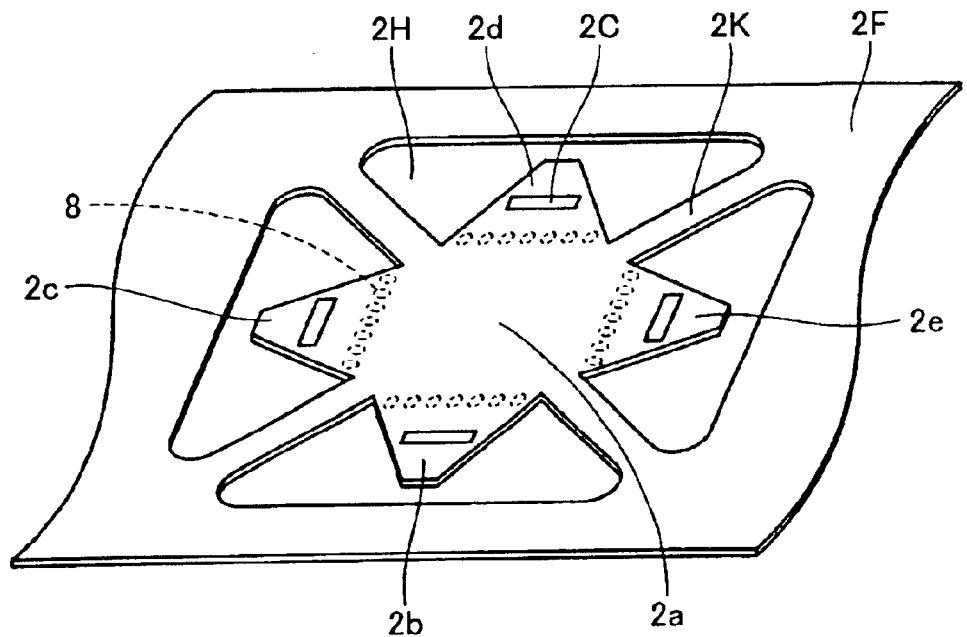
FIGS. 38 to 44 are illustrations related to first to seventh steps showing a manufacturing method of other semiconductor element according to a thirteenth embodiment.

9 as an example. First, as shown in FIG. 38, a band-like wiring board 2F is prepared, and prescribed shape of openings 2H are punched at four position, to form folding areas 2b, 2c, 2d, and 2e, extending radially from four peripheral sides of bottom area 2a in substantially quadrangle shape. For each of folding areas 2b, 2c, 2d, and 2e, an opening 2C is provided. In order to improve working efficiency, bottom area 2a is connected to band-like wiring board 2F by frames 2K. Then, to the prescribed positions on the outer surface of connection portion between bottom area 2a and folding areas 2b, 2c, 2d, and 2e, external terminals 8 are attached in advance.

Figure 39:
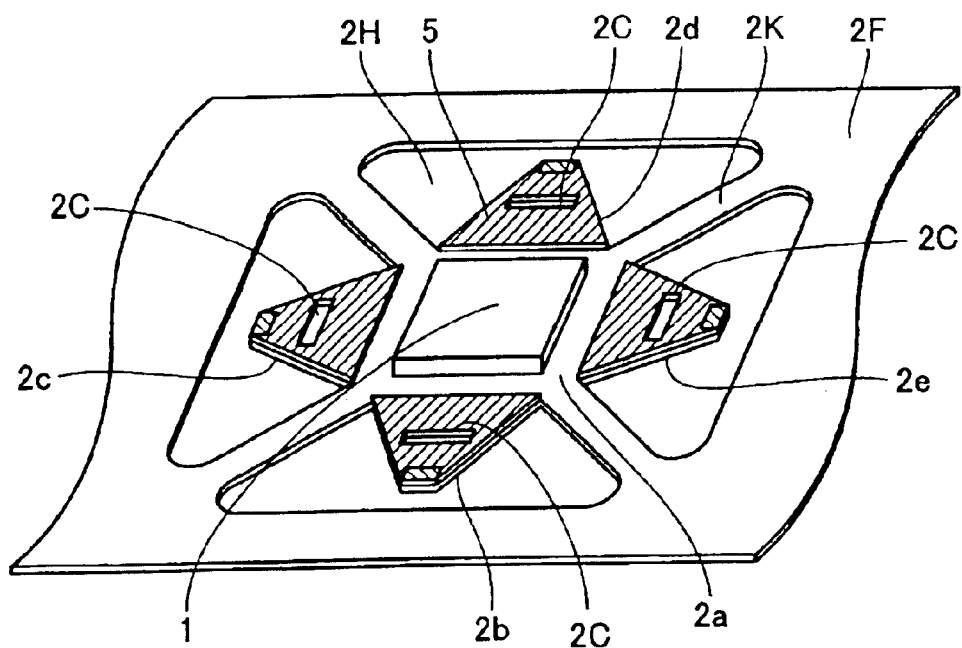
Figure 40:
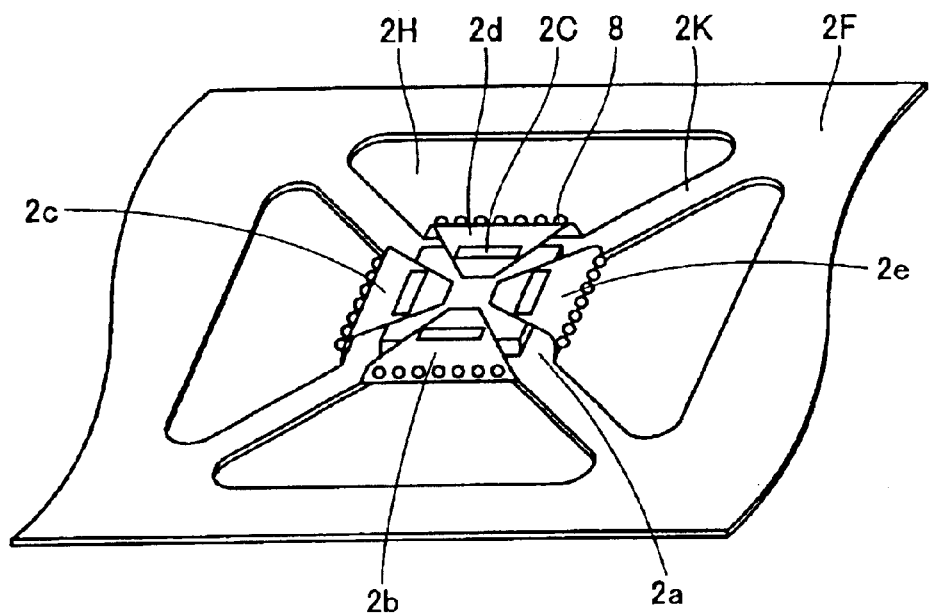

Next, referring to FIG. 39, semiconductor chip 1 is fixed to bottom area 2a by an adhesive tape (adhesive layer) 5. To each of folding areas 2b, 2c, 2d, and 2e also, an adhesive tape (adhesive layer) 6 is applied in advance. Opening 2C should not be covered by adhesive tape (adhesive layer) 6. Thereafter, referring to FIG. 40, folding areas 2b, 2c, 2d, and 2e are folded so as to wrap semiconductor chip 1, and fixed to front side of semiconductor chip 1.

Figure 41:
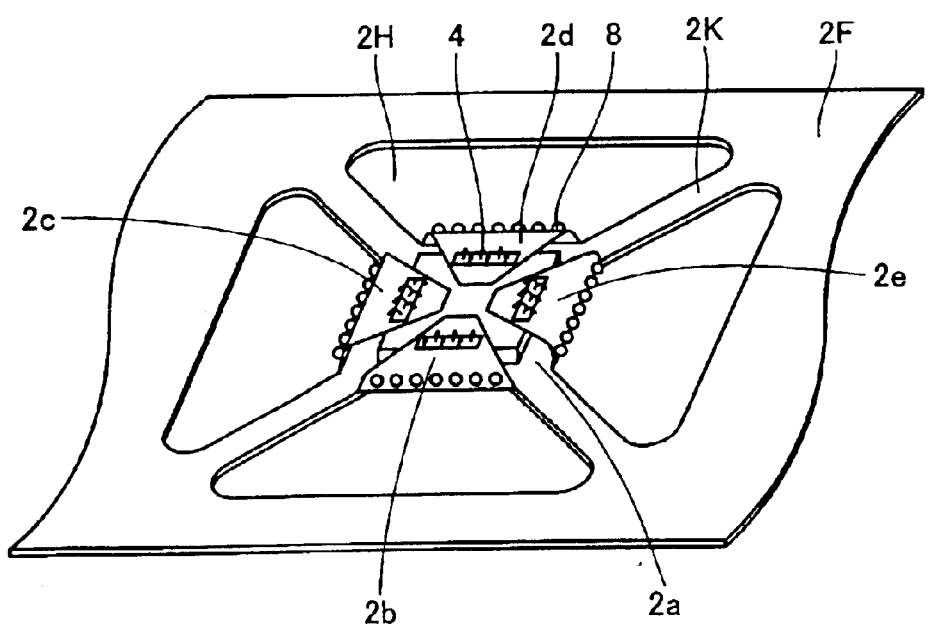
Figure 42:
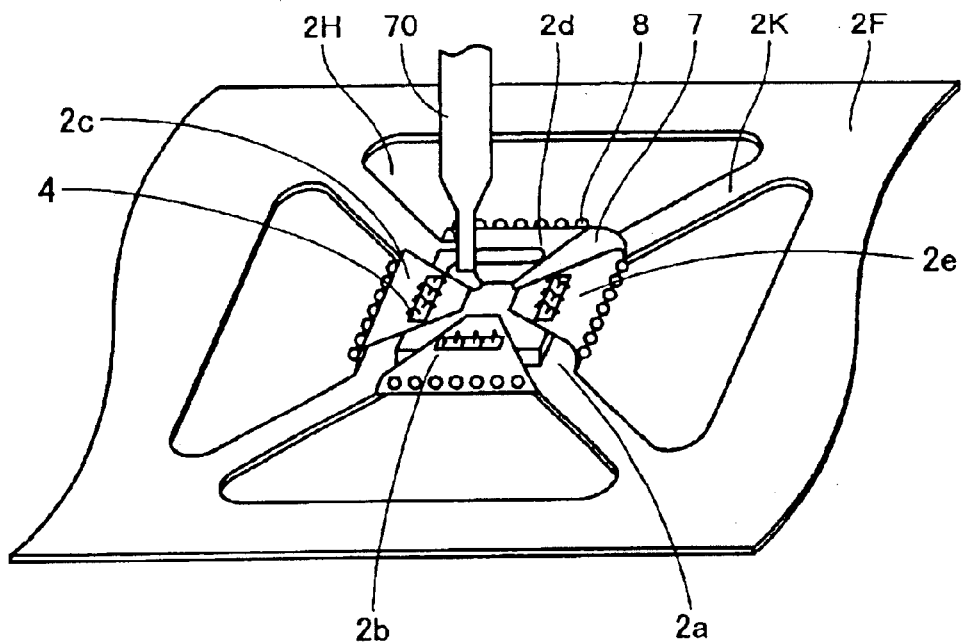
Figure 43:
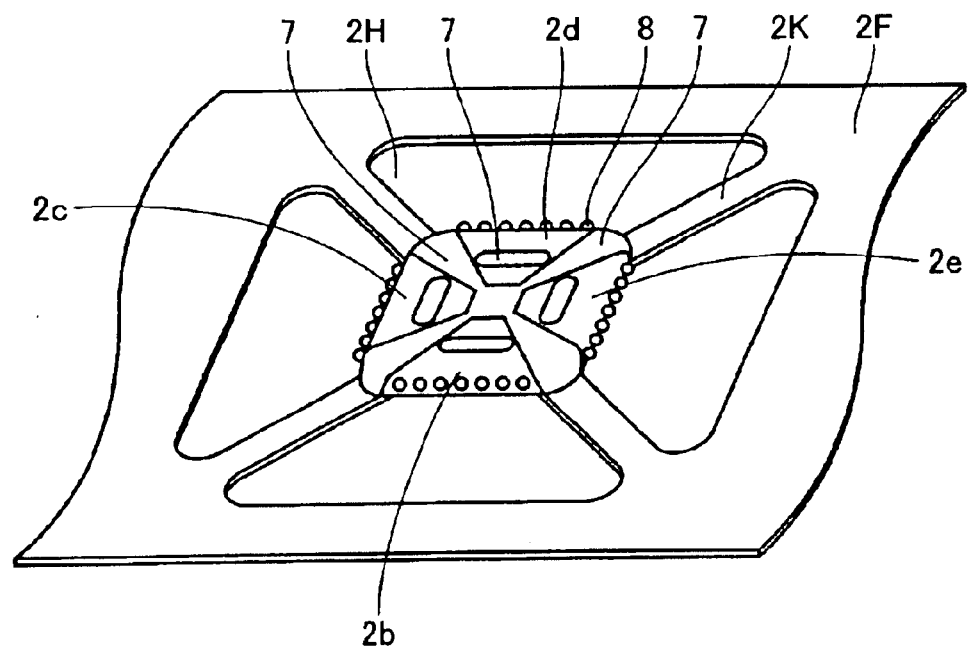

Next, referring to FIG. 41, wire 4 is arranged so as to pass through opening 2C, and electrode area 2B provided on the outer surface of wiring board 2 and electrode area 3 provided on semiconductor chip 1 is connected by wire 4 (wire bonding). Thereafter, referring to FIGS. 42 and 43, resin 7 is injected by a resin injecting device 70 so as to cover opening 2C exposing the connection area of wire 4 between electrode areas 2B and 3 as well as to bury the space between semiconductor chip 1 and wiring board 2 (resin sealing).

Figure 44:
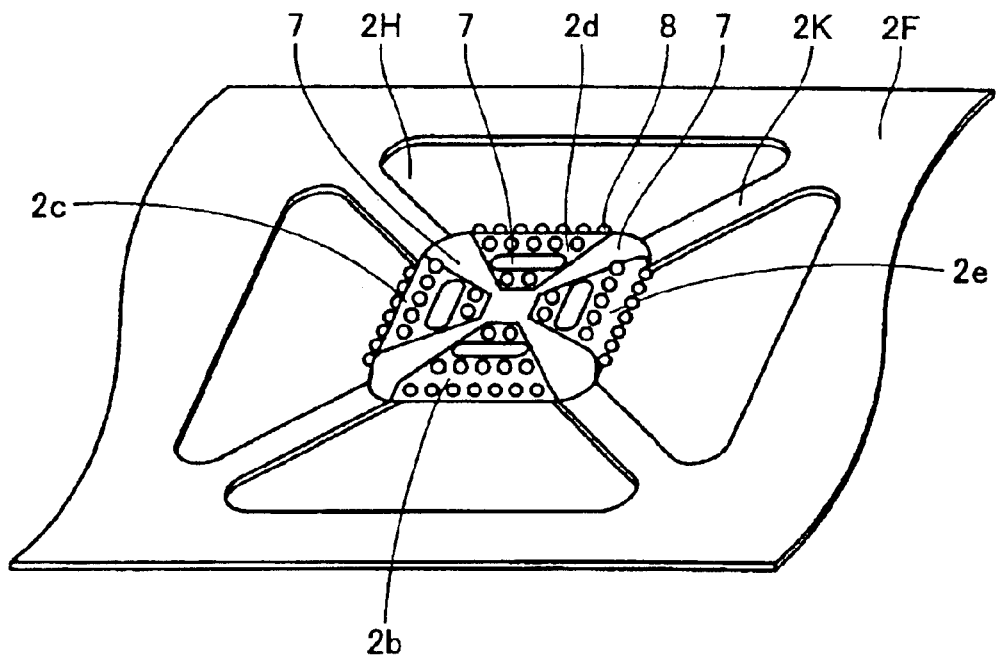
Figure 45:
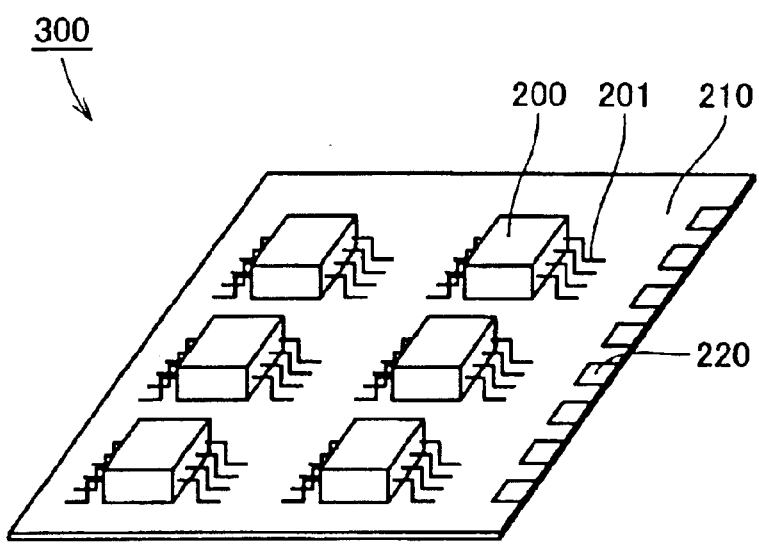
FIG. 45 is an overall perspective view showing the structure of a conventional electronic element (such as a semiconductor device).

Next, referring to FIG. 44, a plurality of external terminals 8 are attached to prescribed positions at the outer surface of bottom area 2a and folding areas 2b, 2c, 2d, and 2e. Thereafter, by cutting frames 2K of band-like wiring board 2F, semiconductor element 114 is completed.

As described above, by forming semiconductor element 114 utilizing band-like wiring board 2F, wiring board 2 can be arranged to surround semiconductor chip 1 and external terminals 8 can be attached to the outer surface of wiring board 2. Additionally, since it is applicable to a mass production line, productivity can also be improved.

Though the twelfth and thirteenth embodiments above are related to manufacturing methods for semiconductor elements 113 and 114 according to the first embodiment, the semiconductor elements according to the second to seventh embodiments and the electronic element according to the eighth embodiment can also be manufactured by applying similar manufacturing method.

In order to implement the electronic elements above in further preferable state, modes described below may be employed.

For example, the electronic element preferably includes connecting means for connecting an electrode area provided to the electronic part and a prescribed electrode area of the wiring board, and an adhesive layer provided between the electronic part and the wiring board, and at least the electrode area and the connecting means are sealed with resin. Thus, the resin sealing of the electrode area and the connecting means prevents short circuit to other external electrical terminals, and further, prevents failure of the connection area between the electrode area and the connecting means. Therefore, reliability of the electronic part is improved.

Further, preferably in the electronic element, the prescribed electrode area of the wiring board is provided on the outer or the inner surface of the wiring board.

Still further, preferably in the electronic element, an abutment portion of opposing ends of the wiring board is provided to the side where the electrode area of the electronic part is provided, so as to wrap the electronic part.

Still further, preferably in the electronic element, an abutment portion of opposing ends of the wiring board is provided to an opposite side to the side where the electrode area of the electronic part is provided, so as to wrap the electronic part.

Still further, preferably in the electronic element, an interconnection layer is provided to intervene the wiring board and the external terminals.

Still further, preferably in the electronic element, a prescribed electrode area is provided to the inner surface of the wiring board, the electrode area provided to the electronic part and the prescribed electrode area of the wiring board are directly connected, and the electronic part is sealed with resin in the wiring board.

Still further, preferably in the electronic device, the respective selected external terminals are directly connected to each other.

Still further, preferably in the electronic device, the respective selected external terminals are connected to each other via a conductive member.

Still further, preferably the electronic apparatus has a structure in which the electronic device is packaged in a cylindrical substrate having an external and internal electrodes corresponding to the outer and inner surface thereof, respectively, and the electronic device is sealed with resin in the cylindrical substrate with the external terminal connected to the prescribed inner electrode.

According to the electronic element and the electronic device according to the present invention, since the external terminals are provided to the outer surface of the wiring board three-dimensionally, not only conventional two-dimensional arrangement but also three-dimensional arrangement can be implemented in the layout of an electric element. As a result, when designing an electronic device formed with a plurality of semiconductor elements, the shape of the electronic device may be determined more freely as compared to the conventional shape, and thus freedom in designing electronic element can largely be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic element, comprising:
    an electronic part;
    a wiring board formed with a flexible material and arranged to surround said electronic part with a prescribed wiring pattern provided to an outer surface thereof for electrically connecting to an electrode area of said electronic part, said wiring board having upper and lower main sides, and lateral sides; and
    a plurality of external terminals arranged to an outer surface of said upper, lower, and lateral sides of said wiring board and connected to an electrode area of said wiring pattern for electrically connecting to outside, wherein said plurality of external terminals are substantially of the same size.

2. The electronic element according to claim 1, further comprising:
    connecting means for connecting the electrode area provided to said electronic part and a prescribed electrode area of said wiring board; and an adhesive layer provided between said electronic part and said wiring board; wherein
at least said electrode area and said connecting means are sealed with resin.

3. The electronic element according to claim 2, wherein said prescribed electrode area of said wiring board is provided on an outer surface of said wiring board.

4. The electronic element according to claim 2, wherein said prescribed electrode area of said wiring board is provided on an inner surface of said wiring board.

5. The electronic element according to claim 1, wherein an abutment portion of opposing ends of said wiring board is provided to a side where said electrode area of said electronic part is provided, so as to wrap said electronic part.

6. The electronic element according to claim 1, wherein an abutment portion of opposing ends of said wiring board is provided to an opposite side to a side where said electrode area of said electronic part is provided, so as to wrap said electronic part.

7. The electronic element according to claim 1, wherein an interconnection layer is provided to intervene between said wiring board and said external terminals.

8. The electronic element according to claim 1, wherein a prescribed electrode area is provided to an inner surface of said wiring board,
an electrode area provided to said electronic part and a prescribed electrode area of said wiring board are directly connected, and
said electronic part is sealed with resin in said wiring board.

9. The electronic element according to claim 1, wherein said electrode area of the electronic part is arranged across the middle of a main side of the electronic part.

10. The electronic element according to claim 1, wherein said electrode area of the electronic part is arranged along diagonals of a main side of the electronic part.

11. The electronic element according to claim 1, wherein a notch is formed along a portion of the wiring board and said electrode area of the electronic part is arranged in said notch along an edge of a main side of the electronic part.

12. An electronic element comprising:
an electronic part;
a wiring board formed with a flexible material and arranged to surround said electronic part with a prescribed wiring pattern provided to an outer surface thereof for electrically connecting to an electrode area of said electronic part; and
a plurality of external terminals arranged to an outer surface of said wiring board three-dimensionally and connected to an electrode area of said wiring pattern for electrically connecting to outside, wherein said plurality of external terminals are substantially of the same size, and
an abutment portion of opposing ends of said wiring board is provided to a side where said electrode area of said electronic part is provided, so as to wrap said electronic part.

13. An electronic element, comprising:
an electronic part;
a wiring board formed with a flexible material and arranged to surround said electronic part with a prescribed wiring pattern provided to an outer surface thereof for electrically connecting to an electrode area of said electronic part; and
a plurality of external terminals arranged to an outer surface of said wiring board three-dimensionally and connected to an electrode area of said wiring pattern for electrically connecting to outside, wherein said plurality of external terminals are substantially of the same size; and
an interconnection layer is provided to intervene between said wiring board and said external terminals.

* * * * *